(12) United States Patent
Brust et al.

(10) Patent No.: US 9,081,282 B1
(45) Date of Patent: Jul. 14, 2015

(54) PATTERN FORMATION USING ELECTROLESS PLATING AND ARTICLES

(71) Applicants: Thomas B. Brust, Webster, NY (US); Catherine A. Falkner, Rochester, NY (US); Mark Edward Irving, Rochester, NY (US)

(72) Inventors: Thomas B. Brust, Webster, NY (US); Catherine A. Falkner, Rochester, NY (US); Mark Edward Irving, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/187,423

(22) Filed: Feb. 24, 2014

(51) Int. Cl.
  *G03F 7/26* (2006.01)
  *G03F 7/16* (2006.01)
  *G03F 7/20* (2006.01)
  *G03F 7/038* (2006.01)

(52) U.S. Cl.
  CPC ............... *G03F 7/16* (2013.01); *G03F 7/0388* (2013.01); *G03F 7/2002* (2013.01)

(58) Field of Classification Search
  CPC ............ H01L 21/288; H01L 21/76823; H01L 21/76825; H01L 21/76838; H01L 21/76843; H01L 21/76873; H01L 24/11; H05K 3/185; H05K 2203/0514; H05K 3/064; H05K 3/106; H05K 3/287; H05K 2201/0236
  USPC ........................ 430/270.1, 311, 322
  See application file for complete search history.

(56) References Cited

U.S. PATENT DOCUMENTS

| 3,799,915 A | 3/1974 | Dunnavant et al. |
| 5,443,865 A * | 8/1995 | Tisdale et al. ................. 427/304 |
| 2004/0224252 A1 * | 11/2004 | Kondo et al. .............. 430/270.1 |
| 2008/0099759 A1 * | 5/2008 | Fujii et al. ....................... 257/40 |

FOREIGN PATENT DOCUMENTS

EP  0 252 150 A1  1/1986

OTHER PUBLICATIONS

L. M. Minsk, et al., "Photosensitive Polymers. I. Cinnamate Esters of Poly(vinyl Alcohol) and Cellulose," Journal of Applied Polymer Science, vol. II, Issue No. 6, pp. 302-307 (1959).

* cited by examiner

*Primary Examiner* — Caleen Sullivan
(74) *Attorney, Agent, or Firm* — J. Lanny Tucker

(57) ABSTRACT

A conductive pattern can be formed using a polymeric layer that contains a reactive composition that comprises a reactive polymer that is metal ion-complexing, water-soluble, and crosslinkable. This reactive polymer comprises pendant groups comprising crosslinkable —C(=O)—CR=CR$^1$—Y— groups wherein R and R$^1$ are defined in the disclosure, as well as metal ion-complexing and water solubilizing groups. The reactive composition can be patternwise exposed to suitable radiation to induce crosslinking within the reactive polymer. The reactive composition and reactive polymer in the non-exposed regions can be removed due to their aqueous solubility, but the exposed regions of the polymeric layer are contacted with electroless seed metal ions, which are then reduced. The resulting electroless seed metal nuclei are electrolessly plated with a suitable metal to form the desired conductive pattern. Various articles can be prepared during this process, and the product article can be incorporated into various electronic devices.

19 Claims, No Drawings

PATTERN FORMATION USING ELECTROLESS PLATING AND ARTICLES

FIELD OF THE INVENTION

This invention relates to methods for forming patterns of a reactive polymer that can be used for forming other material patterns such as conductive metallic patterns, for example using electroless plating. The invention is carried out using water-soluble, cinnamoyl-containing crosslinkable reactive polymers that can be crosslinked upon suitable irradiation. This invention also relates to precursor, intermediate, and product articles related to the inventive method.

BACKGROUND OF THE INVENTION

In recent decades accompanying rapid advances in information-oriented society, there have also been rapid technological advances to provide devices and systems for gathering and communicating information. Of these, display devices have been designed for television screens, commercial signage, personal and laptop computers, personal display devices, and phones of all types, to name the most common information sharing devices.

As the increase in the use of such devices has exploded in frequency and necessity by displacing older technologies, there has been a concern that electromagnetic radiation emission from such devices may cause harm to the human body or neighboring devices or instruments over time. To diminish the potential effects from the electromagnetic radiation emission, display devices are designed with various transparent conductive materials that can be used as electromagnetic wave shielding materials.

In display devices where a continuous conductive film is not practical for providing this protection from electromagnetic radiation emission, it has been found that conductive mesh or patterns can be used for this electromagnetic wave shielding purpose for example as described in U.S. Pat. No. 7,934,966 (Sasaki et al.).

Other technologies have been developed to provide new microfabrication methods to provide metallic, two-dimensional, and three-dimensional structures with conductive metals. Patterns have been provided for these purposes using photolithography and imaging through mask materials as described for example in U.S. Pat. No. 7,399,579 (Deng et al.).

In addition, as the noted display devices have been developed in recent years, attraction has increased greatly for the use of touch screen technology whereby a light touch on a transparent screen surface with a finger or stylus can create signals to cause changes in screen views or cause the reception or sending of information, telecommunications, interaction with the internet, and many other features that are being developed at an ever-increasing pace of innovation. The touch screen technology has been made possible largely by the use of transparent conductive grids on the primary display so that the location of the noted touch on the screen surface can be detected by appropriate electrical circuitry and software.

For a number of years, touch screen displays have been prepared using indium tin oxide (ITO) coatings to create arrays of capacitive patterns or areas used to distinguish multiple point contacts. ITO can be readily patterned using known semiconductor fabrication methods including photolithography and high vacuum processing. However, the use of ITO coatings has a number of disadvantages. Indium is an expensive rare earth metal and is available in limited supply. Moreover, ITO is a ceramic material and is not easily bent or flexed and such coatings require expensive vacuum deposition methods and equipment. In addition, ITO conductivity is relatively low, requiring short line lengths to achieve desired response rates (upon touch). Touch screens used in large displays are broken up into smaller segments in order to reduce the conductive line length to provide acceptable electrical resistance. These smaller segments require additional driving and sensing electronics, further adding to the cost of the devices.

Silver is an ideal conductor having conductivity that is 50 to 100 times greater than that of ITO. Unlike most metal oxides, silver oxide is still reasonably conductive and its use reduces the problem of making reliable electrical connections. Moreover, silver is used in many commercial applications and is available from numerous commercial sources.

In other technologies, transparent polymeric films have been treated with conductive metals such as silver, copper, nickel, and aluminum by such methods as sputtering, ion plating, ion beam assist, wet coating, as well as the vacuum deposition. However, all of these technologies are expensive, tedious, or extremely complicated so that the relevant industries are spending considerable resources to design improved means for forming conductive patterns for various devices especially touch screen displays.

A similar level of transparency and conductivity for patterns can be achieved by producing very fine lines of about 5-6 μm in width of highly conductive material such as copper or silver metal or conductive polymers.

Crosslinkable polymers having cinnamate functionality have been described for use in photoresists for example, by Minsk et al. in the *J. Appl. Polym. Sci.* 1959, 2, 302-307. In general, such polymers have been formulated in organic solvents for application to suitable substrates.

U.S. Pat. No. 3,799,915 (Dunnavant et al.) describes photosensitive polymers derived from cinnamoyl acrylate esters and various co-monomers for use in preparing lithographic printing plates.

While a variety of polymers have been developed for providing conductive patterns using electroless plating methods, such polymers are generally insoluble in water and must be coated out of expensive and sometimes toxic organic solvents.

There is a need for a way to make reactive polymer patterns that can be used for producing thin conductive lines using less expensive materials and plating techniques in order to achieve a substantial improvement in cost, reliability, and availability of conductive patterns for various display devices. It is desirable to achieve these results using aqueous formulations instead of organic solvent coating formulations. The present invention addresses this need as described in considerable detail below.

SUMMARY OF THE INVENTION

The present invention provides a method for using the reactive polymers described herein to address some of the noted problems.

Thus, the present invention provides a method for forming a pattern in a polymeric layer, the method comprising:

providing a polymeric layer comprising a reactive composition that comprises: (1) a reactive polymer that is metal ion-complexing, water-soluble, and crosslinkable, which reactive polymer comprises pendant groups comprising crosslinkable —C(=O)—CR=CR$^1$—Y— groups wherein R and R$^1$ are independently hydrogen or an alkyl group having 1 to 6 carbon atoms, a 5- to 6-membered cycloalkyl group, an alkoxy group having 1 to 6 carbon atoms, a phenyl group, or a phenoxy group, and Y represents a substituted or unsubstituted aryl or aromatic heterocyclic ring and (2) optionally, a photosensitizer, patternwise exposing the polymeric layer to radiation having a $\lambda_{max}$ of at least 150 nm that is sufficient to induce crosslinking within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the exposed regions of the polymeric layer, removing the reactive composition comprising the reactive polymer in the non-exposed regions, contacting the exposed regions of the polymeric layer with electroless seed metal ions to form a pattern of electroless seed metal ions in the exposed regions of the polymeric layer, reducing the pattern of electroless seed metal ions to provide a pattern of corresponding electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

The present invention also provides a precursor article that can be used in the method of this invention, the precursor article comprising a substrate and having disposed thereon a polymeric layer comprising a reactive composition that comprises:

(1) a reactive polymer that is metal ion-complexing, water-soluble, and crosslinkable, which reactive polymer comprises pendant groups comprising crosslinkable —C(=O)—CR=CR$^1$—Y— groups wherein R, R$^1$, and Y are as described below, and (2) optionally, a photosensitizer.

An intermediate article provided during the practice of the present invention, comprises a substrate and having disposed thereon a polymeric layer comprising exposed regions and non-exposed regions, the exposed regions comprising a pattern of at least partially crosslinked polymer that has been derived from a reactive polymer that is metal ion-complexing, water-soluble, and crosslinkable, which reactive polymer comprises pendant groups comprising crosslinkable —C(=O)—CR=CR$^1$—Y— groups wherein R, R$^1$, and Y are as described below, and the non-exposed regions comprising a reactive composition that comprises the reactive polymer that is metal ion-complexing, water-soluble, and crosslinkable, and optionally, a photosensitizer.

Further, another intermediate article provided in the practice of this invention comprises a substrate and having disposed thereon a polymeric layer comprising exposed regions and non-exposed regions, the exposed regions comprising a pattern of at least partially crosslinked polymer that has been derived from a reactive polymer that is metal ion-complexing, water-soluble, and crosslinkable, which reactive polymer comprises pendant groups comprising crosslinkable —C(=O)—CR=CR$^1$—Y— groups wherein R, R$^1$, and Y are as described below, and the non-exposed regions comprising none of the reactive polymer that is metal ion-complexing, water-soluble, and crosslinkable.

In addition, another intermediate article that is provided in the practice of this invention comprises a substrate and having disposed thereon a polymeric layer comprising exposed regions and non-exposed regions, the exposed regions comprising a pattern of electroless seed metal ions complexed within an at least partially crosslinked polymer that has been derived from a reactive polymer that is metal ion-complexing, water-soluble, and crosslinkable, which reactive polymer comprises pendant groups comprising crosslinkable —C(=O)—CR=CR$^1$—Y— groups wherein R, R$^1$, and Y are as described below, and the non-exposed regions comprising none of the electroless seed metal ions or the reactive polymer that is metal ion-complexing, water-soluble, and crosslinkable.

Still again, an intermediate article provided during the practice of this invention comprises a substrate and having disposed thereon a polymeric layer comprising exposed regions and non-exposed regions, the exposed regions comprising a pattern of electroless seed metal nuclei complexed within an at least partially crosslinked polymer that has been derived from a reactive polymer that is metal ion-complexing, water-soluble, and crosslinkable, which reactive polymer comprises pendant groups comprising crosslinkable —C(=O)—CR=CR$^1$—Y— groups wherein R, R$^1$, and Y are as described below, and the non-exposed regions comprising none of the electroless seed metal nuclei or the reactive polymer that is metal ion-complexing, water-soluble, and crosslinkable.

A product article obtained from the method of this invention comprises a substrate and having disposed thereon a polymeric layer comprising exposed regions and non-exposed regions, the exposed regions comprising a pattern of electrolessly plated metal complexed within or deposited on the surface of an at least partially crosslinked polymer that has been derived from a reactive polymer that is metal ion-complexing, water-soluble, and crosslinkable, which reactive polymer comprises pendant groups comprising crosslinkable —C(=O)—CR=CR$^1$—Y— groups wherein R, R$^1$, and Y are as described below, and the non-exposed regions comprising none of the electrolessly plated metal or the reactive polymer that is metal ion-complexing, water-soluble, and crosslinkable.

The present invention provides an efficient method for forming conductive metal patterns using a specifically designed reactive polymer that can be coated out of an aqueous formulation and crosslinked during appropriate irradiation (UV or visible light). The reactive polymer can undergo crosslinking reactions including but not limited to a photocycloaddition reaction, through adjacent or proximate cinnamoyl or cinnamoyl-like groups upon irradiation and the incorporated water-solubilizing groups can also provide electroless seed metal ion-complexation sites. Because of the crosslinking function of the reactive polymer, additional crosslinking agents in the reactive composition are unnecessary.

Crosslinking with the reactive polymer crosslinking provides water-insoluble metal ion complexation sites in the exposed regions of a polymeric layer while leaving the non-exposed regions water-soluble so the reactive polymer can be removed before conductive metal patterns are formed in the exposed regions. The water-solubility of the reactive polymer is provided generally by the incorporation of suitable amounts of pendant water-solubilizing groups along the reactive polymer backbone. Thus, the reactive polymer has two essential functions and components: (1) pendant crosslinkable groups described herein, and (2) pendant reactive and water-solubilizing groups. Both of these groups are incorporated into the reactive polymer in desirable proportions.

The present invention avoids the use of expensive high vacuum processes necessary for making conductive patterns using indium tin oxide (ITO) coatings and is more readily carried out using high-speed roll-to-roll machines for higher manufacturing efficiencies.

DETAILED DESCRIPTION OF THE INVENTION

Definitions

As used herein to define various ethylenically unsaturated polymerizable monomer components (or recurring units) of the reactive polymers, solutions, reactive compositions, aqueous-based solutions, and polymeric layers, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, or layer. Unless otherwise indicated, the percentages can be the same for either a dry layer or pattern, or for the total solids of the formulation or composition.

The term "homopolymer" is meant to refer to polymeric materials that have the same repeating or recurring unit along a polymer backbone. The term "copolymer" refers to polymeric materials composed of two or more different repeating or recurring units that are arranged randomly along the polymer backbone.

The recurring units in the reactive polymers used in this invention are not intentionally incorporated into the reactive polymers in block arrangements, but the recurring units can be incorporated into the backbone in any fashion using known polymerization procedures. The reactive polymers can be entirely random in the arrangement of recurring units, or there can be blocks of one or more different recurring units arranged along the polymer chain, or there can be both random and block arrangements of recurring units along the same polymer chain.

Recurring units in reactive polymers described herein are generally derived from the corresponding ethylenically unsaturated polymerizable monomers used in a polymerization process, which ethylenically unsaturated polymerizable monomers have the desired functional and pendant groups. Alternatively, pendant groups can be incorporated within recurring units after polymerization of ethylenically unsaturated polymerizable monomers by reaction with requisite precursor pending groups.

The term "reactive polymer" is used herein to refer to the polymers described below that have the essential components and properties described and can be used in the method of the present invention.

By "solubility or dispersibility" in reference to the reactive polymer, we mean that a uniform stable solution or dispersion of reactive polymer can be prepared using a desired solvent at a solids concentration that is useful for use in the present invention, for example preparation of coating formulations.

The term "aqueous-based" refers to solutions, baths, or dispersions in which the predominant solvent, or at least 50 weight % of the solvents, is water.

Unless otherwise indicated, the term "mol %" when used in reference to recurring units in reactive polymers, refers to either the nominal (theoretical) amount of a recurring unit based on the molecular weight of ethylenically unsaturated polymerizable monomer used in the polymerization process, or to the actual amount of recurring unit in the resulting reactive polymer as determined using suitable analytical techniques and equipment.

Uses

The methods of this invention can be used to provide reactive polymer patterns that can be used to form conductive metal patterns as described herein, which conductive metal patterns can be incorporated into various devices including but not limited to touch screen or other display devices.

For example, the reactive compositions described herein can be used for a variety of purposes where efficient photopolymerization and metal pattern formation is needed in various articles or devices. Such reactive compositions must be sensitive to a chosen radiation wavelength as noted above. For example, the reactive compositions can be used in various methods that can provide conductive metal patterns, for example using electroless plating procedures, which conductive metal patterns can be incorporated into various devices including but not limited to touch screen or other display devices that can be used in numerous industrial, consumer, and commercial products.

For example, touch screen technology can comprise different touch sensor configurations including capacitive and resistive touch sensors. Resistive touch sensors comprise several layers that face each other with a gap between adjacent layers that may be preserved by spacers formed during manufacturing. A resistive touch screen panel can comprise several layers including two thin, metallic, electrically conductive layers separated by a gap that can be created by spacers. When a object such as a stylus, palm, or finger presses down on a point on the panel's outer surface, the two metallic layers come into contact and a connection is formed that causes a change in the electrical current. This touch event is sent to a controller for further processing.

Capacitive touch sensors can be used in electronic devices with touch-sensitive features. These electronic devices can include but are not limited to, televisions, monitors, and projectors that can be adapted to display images including text, graphics, video images, movies, still images, and presentations. The image devices that can be used for these display devices that can include cathode ray tubes (CRS's), projectors, flat panel liquid crystal displays (LCD's), LED systems, OLED systems, plasma systems, electroluminescent displays (ECD's), and field emission displays (FED's). For example, the present invention can be used to prepare capacitive touch sensors that can be incorporated into electronic devices with touch-sensitive features to provide computing devices, computer displays, portable media players including e-readers, mobile telephones and other communicating devices.

Systems and methods of fabricating flexible and optically compliant touch sensors in a high-volume roll-to-roll manufacturing process where micro electrically conductive features can be created in a single pass are possible using the present invention. The reactive compositions can be used in such systems and methods with multiple printing members to form multiple high resolution conductive images from predetermined designs of patterns provided in those multiple printing members. Multiple patterns can be printed on one or both sides of a substrate. For example, one predetermined pattern can be printed on one side of the substrate and a different predetermined pattern can be printed on the opposing side of the substrate. The printed patterns of the photopolymerizable compositions can then be further processed to provide conductive metal patterns using electroless metal plating.

Reactive Polymers for Pattern Formation

In general, the reactive polymers useful in the practice of this invention have two essential features: (1) they comprise crosslinkable groups (defined below) that upon exposure to suitable radiation can participate in crosslinking among adjacent (or proximate) groups of the same type, and (2) reactive water-solubilizing groups. While the reactive polymers can be supplied as aqueous-based reactive compositions, they are best used when applied to a substrate that can have a large or small surface, including the outer surfaces of inorganic or organic particles and then dried. Thus, the reactive polymers are metal ion-complexing (as described below), water-soluble, and crosslinkable.

The reactive polymers can be either condensation or vinyl polymers as long as the requisite crosslinkable and water-solubilizing groups are connected to and arranged along the reactive polymer backbone. In most embodiments, the useful reactive polymers are vinyl polymers derived from ethylenically unsaturated polymerizable monomers using solution or emulsion polymerization techniques and conditions, initiators, surfactants, catalysts, and solvents, all of which would be readily apparent to one skilled in the art from the teaching provided herein.

The useful reactive polymers generally comprise at least some recurring units arranged along the reactive polymer backbone that comprise pendant crosslinkable groups comprising —C(=O)—CR=CR$^1$—Y— groups wherein R, R$^1$, and Y are defined as follows.

Specifically, R and R$^1$ are independently hydrogen or substituted or unsubstituted alkyl groups having at least 1 to 7 carbon atoms (including substituted or unsubstituted methyl, ethyl, isopropyl, t-butyl, hexyl, and benzyl groups, and others that would be readily apparent to one skilled in the art), substituted or unsubstituted cycloalkyl group having 5 or 6 carbon atoms in the ring (such as cyclopentyl, cyclohexyl, 4-methylcyclohexyl, and others that would be readily apparent to one skilled in the art), substituted or unsubstituted phenyl groups (such as phenyl, tolyl, and xylyl groups, and others that would be readily apparent to one skilled in the art), substituted or unsubstituted alkoxy groups having 1 to 7 carbon atoms (such as methoxy, ethoxy, benzoxy, and others readily apparent to one skilled in the art), or substituted or unsubstituted phenoxy groups (such as phenoxy, 2,4-dimethylphenoxy, and others that would be readily apparent to one skilled in the art). In some embodiments, R and R$^1$ can also be nitro, cyano, or halogen groups.

The crosslinkable —C(=O)—CR=CR$^1$—Y— groups can be attached to the reactive polymer backbone in any suitable manner through a suitable divalent group that is attached to either the carbonyl moiety [—C(=O)—] or the —CR$^1$—Y— moiety of the crosslinkable group. In either case, the divalent group can be any of those that a skilled worker in the art would readily understand as chemically possible, including the R$^2$ groups described below.

When the crosslinkable group is attached to the reactive polymer backbone through a suitable divalent group that is attached to the —Y— moiety, the carbonyl moiety is usually attached to a substituted or unsubstituted alkoxy or alkyl group having 1 to 10 carbon atoms (including benzyl groups) or to a substituted or unsubstituted phenyl or naphthyl group. The carbonyl moiety can also be a carboxylic acid or aldehyde.

In most embodiments, however, the crosslinkable group is defined by —C(=O)—CR=CR$^1$—Y— wherein R and R$^1$ are as defined above and Y is defined below and the open valence shown for "Y" is generally filled with a hydrogen atom, or an alkyl group as described below for substituted Y groups. Such crosslinkable groups then are attached to the reactive polymer backbone using a single bond or a suitable divalent group that is attached to the carbonyl moiety, for example those described by R$^2$ below.

In most embodiments, when the crosslinkable group is attached to the reactive polymer backbone through the carbonyl moiety, Y is a substituted or unsubstituted carbocyclic aryl group, or a substituted or unsubstituted heteroaryl group having one or more heteroatoms (oxygen, sulfur, or nitrogen) and sufficient carbon atoms to complete an aromatic heterocyclic ring. Such aromatic rings can have one or more substituents that do not adversely affect the desired behavior in the crosslinking reactions induced by the irradiation described herein.

Useful Y groups can be either heterocyclic or carbocyclic rings having desired aromaticity and any of these rings can be substituted with one or more substituents that do not adversely affect the function of the reactive polymer. Representative aromatic Y groups include but are not limited to, substituted or unsubstituted phenyl, naphthyl, anthracyl, 4-nitrophenyl, 2,4-dichlorophenyl, 4-ethylphenyl, tolyl, 4-dodecylphenyl, 2-nitro-3-chlorophenyl, 4-methoxyphenyl, 2-furyl, 2-thienyl, 3-indolyl, and 3-pyridyl rings. The substituted or unsubstituted phenyl rings are particularly useful including but not limited to phenyl, tolyl, xylyl, 4-methoxyphenyl, hydroxyphenyl, and chlorophenyl groups. Substituted or unsubstituted phenyl or 3-pyridyl groups are particularly useful Y groups.

More particularly, R and R$^1$ are independently hydrogen or substituted or unsubstituted methyl, ethyl or phenyl groups, especially when Y is a substituted or unsubstituted phenyl group as described below.

Upon exposure to suitable radiation having a $\lambda_{max}$ of at least 150 nm and up to and including 700 nm, or more likely exposed to radiation having a $\lambda_{max}$ of at least 150 nm and up to and including 450 nm, the noted crosslinkable —C(=O)—CR=CR$^1$—Y— groups are electronically excited such that they can react with other pendant groups in the reactive polymer to form crosslinks for example as the product of photocycloaddition reactions.

The reactive polymers particularly become crosslinked among adjacent or proximate (molecularly near enough for example for cycloaddition crosslinking) crosslinkable groups during or after the noted irradiation. Thus, essential crosslinking can be accomplished using the reactive polymer without additional crosslinking agents. However, if desired, crosslinking can be further provided using distinct compounds that are dispersed as crosslinking agents within the polymeric layer (described below) comprising one or more reactive polymers. Such crosslinking agents react at either the crosslinkable groups or at the pendant water solubilizing groups depending upon the chemical structure of crosslinking agent. For the pendant crosslinkable groups described above, crosslinking is achieved by having at least two of such crosslinkable groups in proximity that can react with one another, while incorporated aziridines or carbodiimides can react with reactive water-solubilizing groups such as pendant carboxy (carboxylic acid) groups.

Particularly useful reactive polymers can be represented by the following essential —A—, —B—, and optional —C— recurring units in any order (random or otherwise) along the polymer backbone.

In particular, the essential —A— recurring units can be derived from any ethylenically unsaturated polymerizable monomer having appropriate pendant groups comprising one or more crosslinkable —C(=O)—CR=CR$^1$—Y— groups wherein R, R$^1$, and Y are as defined above.

More particularly, the —A— recurring units can be further defined in reference to the following Structure (—A—) containing crosslinkable groups:

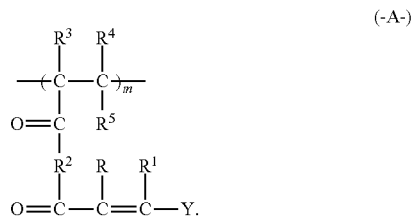

In this structure, R, R$^1$, and Y are as defined above. R$^2$ can be a divalent linking group including but are not limited to, substituted or unsubstituted alkylene (including haloalkylenes and cyanoalkylenes), alkyleneoxy, alkoxyalkylene, iminoalkylene, cycloalkylene, aralkylene, cycloalkylenealkylene, and aryloxyalkylene groups wherein the divalent hydrocarbon groups can comprise 1 to 20 carbon atoms (in either linear, branched, or cyclic form). A skilled worker in polymer chemistry would be able to design other useful linking groups using suitable number of carbon and hetero (oxygen, nitrogen, or sulfur) atoms in an order and arrangement that are chemically possible. Particularly useful R$^2$ divalent groups are substituted or unsubstituted alkylene groups such as substituted or unsubstituted ethylene or propylenes.

R$^3$, R$^4$, and R$^5$ are independently hydrogen, a halogen, a substituted or unsubstituted alkyl group having 1 to 6 carbon atoms, a substituted or unsubstituted cyclohexyl group, or a substituted or unsubstituted phenyl group. In particular, R$^3$, R$^4$, and R$^5$ are independently hydrogen, chloro, methyl, or ethyl groups.

Some particularly useful ethylenically unsaturated polymerizable monomers from which —A— recurring units can be derived include:
2-cinnamoyl-ethyl methacrylate,
2-cinnamoyl-ethyl acrylate,
2-[3-(3-pyridyl)acryloyl]ethyl methacrylate,
2-[ethyl 3-(4-oxyphenyl)acrylate]ethyl methacrylate, and
2-[ethyl 3-(4-carbonyloxyphenyl)acrylate]ethyl methacrylate.

The —A— recurring units can also be formed after formation of a reactive polymer having precursor —A— recurring units. For example, a polymer can be prepared with recurring units derived from vinyl alcohols or acrylate monomers having pendant hydroxyl groups, and the pendant hydroxyl groups can be reacted with cinnamoyl chloride (or similar substituted cinnamoyl-like chloride reactants) to form the desired —A— recurring units with pendant water-solubilizing groups already within the polymer before the reaction to form the —A— recurring units.

Useful essential —B— recurring units within the reactive polymer can be derived from any ethylenically unsaturated polymerizable monomer that comprises pendant water-solubilizing groups, or pendant precursor groups that can be converted to water-solubilizing groups after polymerization. Such pendant water-solubilizing groups are also generally metal ion-complexing (or metal ion-reactive) and include but are not limited to, carboxylic acid, sulfonic acid, and phosphonic acid groups as well as neutralized salts of these acid groups (such as carboxylate and sulfonate groups). The sulfonic acid, sulfonate, carboxylic acid, and carboxylate groups are particularly useful. Other useful pendant water-solubilizing groups would be readily apparent to one skilled in the art. Useful pendant precursor groups include but are not limited to, anhydrides, esters (such as tertiary alkyl esters), alcohols, and benzyl groups such as iminobenzyl sulfonates and nitrobenzyl sulfonates.

For example, the essential —B— recurring units can be represented by the following Structure (—B—):

wherein B' represents a pendant group comprising the desired water-solubilizing group (noted above) or precursor groups, which group can be directly attached to the reactive polymer backbone or it can be attached through a suitable divalent linking group.

For example, some useful ethylenically unsaturated polymerizable monomers from which the —B— recurring units can be derived include but are not limited to, acrylic acid, methacrylic acid, styrene sulfonic acid, itaconic acid, maleic anhydride, fumaric acid, citraconic acid, vinyl benzoic acid, 2-carboxyethyl acrylate, 2-carboxyethyl methacrylate, 2-acrylamido-2-methyl-1-propane sulfonic acid, 2-sulfoethyl methacrylate, styrene sulfonates, and styrene sulfonic acid. Partially or fully neutralized counterparts of these monomers are also useful.

In addition to the —A— and —B— recurring units described above that are essential in useful reactive polymers, the reactive polymers can further comprise one or more additional recurring units that are different from all —A— and —B— recurring units, and herein identified as optional —C— recurring units. A skilled polymer chemist would understand how to choose such additional recurring units, and for example, they can be derived from one or more ethylenically unsaturated polymerizable monomers selected from the group consisting of alkyl acrylates, alkyl methacrylates, (meth)acrylamides, styrene and styrene derivatives, vinyl ethers, vinyl benzoates, vinylidene halides, vinyl halides, vinyl imides, and other materials that a skilled worker in the art would understand could provide desirable properties to the reactive polymer. Such —C— recurring units can be represented by the following Structure (—C—):

wherein the D groups in the —C— recurring units can be for example, hydrogen, substituted or unsubstituted alkyl groups (such as hydroxyalkyl groups), substituted or unsubstituted aryl groups (such as substituted or unsubstituted phenyl groups including those found in styrenes), alkyl ester groups, aryl ester groups, halogens, or ether groups. In many useful —C— recurring units, the D groups are alkyl carboxyl ester groups wherein the alkyl moiety has 1 to 6 carbon atoms and is linear, branched, or cyclic in form.

In addition, some —C— recurring units can comprise an epoxy (such as a glycidyl group) or epithiopropyl group derived for example from glycidyl methacrylate or glycidyl acrylate.

In the —B— and —C— recurring units in the noted Structures, R, R', and R" can be the same or different hydrogen, methyl, ethyl, or chloro groups and each type of recurring unit can have the same or different R, R', and R" groups along the polymer backbone. In most embodiments, R, R', and R" are hydrogen or methyl, and R, R', and R" can be the same or different for the various —B—, and —C— recurring units in a given reactive polymer. In addition, the R, R', and R" groups in the —B— and —C— recurring units can be the same or different as the $R^3$, $R^4$, and $R^5$ groups in the —A— recurring units.

In some embodiments, the reactive polymer comprises a backbone and arranged along the backbone:

—A— recurring units comprising pendant groups comprising the crosslinkable —C(=O)—CR=$CR^1$—Y— groups wherein R, $R^1$, and Y are defined above, and —B— recurring units comprising pendant metal ion-reactive and water-solubilizing groups, wherein the —A— recurring units are present in an amount of at least 2 mol % and up to and including 50 mol %, and the —B— recurring units are present in an amount of at least 50 mol % and up to and including 98 mol %, both based on the total recurring units in the reactive polymer.

In particular, some —B— recurring units comprise carboxylic acid, carboxylate, sulfonic acid, or sulfonate groups, or a mixture of such pendant groups in randomly occurring recurring units along the reactive polymer backbone.

For example, the reactive polymer can comprise at least 2 mol % and up to and including 50 mol % of —A— recurring units comprising crosslinkable —C(=O)—CH=CH-phenyl groups, based on the total recurring units in the reactive polymer, wherein the phenyl groups are substituted or unsubstituted as described above for the aryl Y groups.

In addition, such reactive polymers can further comprise one or more additional —C— recurring units that are different from all —A— and —B— recurring units, the one or more additional —C— recurring units being present in an amount of up to and including 50 mol % based on the total reactive polymer recurring units.

In the —A—, —B—, and —C— recurring unit formulae shown above, "m", "n", and "p" are used to represent the respective molar amounts of recurring units, based on total recurring units, in a given reactive polymer, so that the sum of m, n, and p equal 100 mol % in a given reactive polymer. However, it is to be understood that "m" and "n" do not only refer to the amounts of the —A— and —B— recurring units, but to all recurring units in the reactive polymer that provide the desired functionalities (crosslinking and water-solubility) as described above.

In general, m is at least 2 mol %, or even at least 5 mol % and up to and including 50 mol %, or at least 10 mol % and up to and including 40 mol %, based on the total recurring units in the reactive polymer. In addition, n generally represents at least 50 mol % and up to and including 98 mol %, or more typically at least 60 mol % and up to and including 95 mol %, or even at least 70 mol % and up to and including 90 mol %, based on the total recurring units in the reactive polymer.

Moreover, while p can be 0 mol %, it also can be up to and including 50 mol %, or typically at least 1 mol % and up to and including 20 mol %, or at least 2 mol % and up to and including 10 mol %, based on the total recurring units in the reactive polymer.

The mol % amounts of the various recurring units defined herein for the reactive polymers defined herein are meant to refer to the actual molar amounts present in the reactive polymers. It is understood by one skilled in the art that the actual mol % values may differ from those theoretically possible from the amount of ethylenically unsaturated polymerizable monomers that are used in the polymerization procedure. However, under most polymerization conditions that allow high polymer yield and optimal reaction of all monomers, the actual mol % of each monomer is generally within +15 mol % of the theoretical amounts.

Some representative reactive polymer embodiments include but are not limited to, the following copolymers and terpolymers wherein the molar ratios are theoretical (nominal) amounts based on the actual molar ratio of ethylenically unsaturated polymerizable monomers used in the polymerization process. The actual molar amounts of recurring units can differ from the theoretical (nominal) amounts of monomers if the polymerization reactions are not carried out to completion.

Poly(methacrylic acid-co-2-cinnamoylethyl methacrylate) (90:10);
Poly(acrylic acid-co-2-cinnamoylethyl methacrylate) (80:20);
Poly(acrylic acid-co-2-cinnamoylethyl methacrylate) (70:30);
Poly(acrylic acid-co-2-cinnamoylethyl methacrylate) (60:40);
Poly(acrylic acid-co-2-cinnamoylethyl methacrylate) (50:50);
Poly(2-acrylamindo-2-methyl-1propanesulfonic acid-co-2-cinnamoylethyl methacrylate (80:20);
Poly(2-carboxyethyl methacrylate-co-2-cinnamoylethyl methacrylate (80:20);
Poly(2-sulfoethyl methacrylate-co-2-cinnamoylethyl methacrylate (80:20);
Poly(styrene sulfonic acid-co-2-cinnamoylethyl methacrylate) (80:20); and
Poly(methacrylic acid-co-2-[3-(3-pyridyl)acryloyl]ethyl methacrylate) (80:20),
Poly(methacrylic acid-co-[ethyl 3-(4-oxyphenyl)acrylate] ethyl methacrylate) (80:20), and
Poly[methacrylic acid-co-2-[ethyl 3-(4-carbonyloxyphenyl)-acrylate]ethyl methacrylate) (80:20).

The reactive polymers useful in the invention generally have a molecular weight ($M_w$) of at least 30,000 and up to and including 300,000 as measured by gel permeation chromatography (GPC) or by size exclusion chromatography (SEC).

Examples of reactive polymers can be prepared using known free radical solution polymerization techniques using known starting materials, free radical initiators, and reaction conditions in suitable organic solvents such as tetrahydrofuran that can be adapted from known polymer chemistry. Where starting materials (such as ethylenically unsaturated polymerizable monomers) are not available commercially, such starting materials can be synthesized using known chemical starting materials and procedures.

Representative preparations of particularly useful reactive polymers are provided below for the Invention Examples.

Additional details of polymerization procedures and starting materials can be found in U.S. Pat. No. 3,799,915 (noted above), the disclosure of such details being incorporated herein by reference. For example, once the reactive polymer is prepared in a suitable organic reaction solvent, it can be extracted into water by partial or complete neutralization of the water-solubilizing groups to render the reactive polymer highly water soluble. This aqueous solution of the neutralized reactive polymer can be diluted or concentrated as desired for application to a substrate, and is generally present at a concentration of less than 20 weight %.

In general, the reactive polymers can be stored in solution in suitable aqueous solutions or dispersions. Depending upon the sensitivity of the reactive polymer to light (such as room light), during and after preparation, the reactive polymers can be kept in the dark or away from light exposure until they are formulated into reactive compositions and used for various purposes. To enhance storage stability, one or more acid scavengers, such as hindered amines, can be added to the reactive polymer solution during or after polymerization. A skilled polymer chemist would know what compounds would be suitable as acid scavengers and how much to use with a particular reactive polymer and desired storage stability.

Reactive Compositions

The reactive polymers described herein can be used in reactive compositions incorporated into polymeric layers in various methods for forming conductive patterns, for example using electroless plating.

Each reactive composition has only one essential component, that is, one or more reactive polymers as described above that can be crosslinked in the crosslinkable groups upon exposure to radiation having $\lambda_{max}$ of at least 150 nm and up to and including 700 nm, or of at least 150 nm and up to and including 450 nm, as described below, and which reactive polymers also comprise pendant water-solubilizing groups as described above. While various other optional components can be included as described below, only the reactive polymer is essential for providing the desired precursor article, intermediate articles, product articles, and conductive electroless metal plated pattern in the reactive composition forming the polymeric layer as described herein.

One or more reactive polymers as described above are generally present in the reactive composition (and in the resulting dry polymeric layer) in an amount of at least 50 weight % and up to and including 100 weight %, or typically at least 80 weight % and up to and including 98 weight %, based on the total solids in the reactive composition (or total dry weight of the polymeric layer).

The reactive compositions generally do not include separate crosslinking agents or crosslinking agent precursors because the reactive polymer itself includes sufficient crosslinkable groups (described above). However, as noted above, the —C— recurring units can also include additional crosslinking groups.

While not essential, it is sometimes desirable to enhance the sensitivity of some reactive polymers to longer wavelengths (for example, at least 300 nm and up to and including 700 nm, or at least 150 nm and up to and including 450 nm) by including one or more photosensitizers in the reactive composition used in this invention. A variety of photosensitizers are known in the art such as benzothiazole and naphthothiazole compounds as described in U.S. Pat. No. 2,732,301 (Robertson et al.), aromatic ketones as described in U.S. Pat. No. 4,507,497 (Reilly, Jr.), and ketocoumarins, as described for example in U.S. Pat. No. 4,147,552 (Specht et al.) and U.S. Pat. No. 5,455,143 (Ali). Particularly useful photosensitizers for long UV and visible light sensitivity include but are not limited to, 2-[bis(2-furoyl)methylene]-1-methylnaphtho[1,2-d]thiazoline, 2-benzoylmethylene-1-methyl-β-napthothiazoline, 3,3'-carbonylbis(5,7-diethoxycoumarin), 3-(7-methoxy-3-coumarinoyl)-1-methylpyridinium fluorosulfate, 3-(7-methoxy-3-coumarinoyl)-1-methylpyridinium 4-toluenesulfonic acid, and 3-(7-methoxy-3-coumarinoyl)-1-methylpyridinium tetrafluoroborate. Other useful compounds are described in Columns 6 and 7 of U.S. Pat. No. 4,147,552 (noted above) which compounds are incorporated herein by reference.

One or more photosensitizers can be present in the reactive composition (and resulting dry polymeric layer) in an amount of at least 0.1 weight % and up to and including 10 weight %, or more likely at least 0.5 weight % and up to and including 5 weight %, based on the total solids in the reactive composition (or total dry weight of the polymeric layer).

The reactive compositions can optionally include one or more addenda such as film-forming compounds, surfactants, plasticizers, filter dyes, viscosity modifiers, and any other optional components that would be readily apparent to one skilled in the art, and such addenda can be present in amounts that would also be readily apparent to one skilled in the art.

The essential reactive polymer and any optional compounds described above are generally dissolved or dispersed in water or a mixture of water and water-miscible organic solvents to form a reactive composition that can be applied to a suitable substrate (described below) in a suitable manner. Useful water-miscible organic solvents include but are not limited to, alcohols such as methanol, ethanol, and isopropanol and polyols such as ethylene glycol, propylene glycol, and glycerol.

Articles

The reactive composition described above can be applied to a suitable substrate using any suitable method including but not limited to, spin coating, bead coating, blade coating, curtain coating, or spray coating, from a suitable reservoir to form a polymeric layer. Useful substrates can be chosen for particular use or method as long as the substrate material will not be degraded by the reactive composition or any treatments to which the resulting precursor articles are subjected during the method of this invention. The reactive composition can be applied multiple times if desired to obtain a thicker coating (reactive polymer layer) of the reactive composition, and dried between each coating or dried only after the last application. Water and any water-miscible organic solvents can be removed from the reactive composition using any suitable drying technique.

In general, the final dry coating of reactive composition (polymeric layer) can have an average dry thickness of at least 10 nm and up to and including 1 mm, with a dry thickness of at least 0.1 μm and up to and including 100 μm being more useful. The average dry thickness can be determined by measuring the dry layer thickness in at least 10 different places within a 10 cm by 10 cm square of the dry reactive layer using an electron microscope or other suitable analytical device.

Thus, useful substrates can be composed of glass, quartz, and ceramics as well as a wide variety of flexible materials such as cellulosic papers and polyesters including poly(ethylene terephthalate) and poly(ethylene naphthalate), polycarbonates, polyamides, poly(meth)acrylates, and polyolefins. Useful polymeric substrates can be formed by casting or extrusion methods. Laminates of various substrate materials can also be put together to form a composite substrate. Any of the substrates can be treated to improve adhesion using for example corona discharge, oxygen plasma, ozone or chemical treatments using silane compounds such as aminopropyltriethoxysilane. The substrates can be of any suitable dry thickness including but not limited to at least 10 µm and up to and including 10 mm, depending upon the intended use of the resulting articles.

Particularly useful substrates are composed of poly(ethylene terephthalate) such as biaxially oriented poly(ethylene terephthalate) (PET) films that have broad uses in the electronics market. These PET films, ranging in dry thickness of at least 50 µm and up to and including 200 µm, can also comprise, on at least one side, a polymeric primer layer (also known as a subbing layer, adhesive layer, or binder layer) that can be added prior to or after film stretching. Such polymeric primer layers can comprise polyacrylonitrile-co-vinylidene chloride-co-acrylic acid), poly(methyl acrylate-co-vinylidene chloride-co-itaconic acid), poly(glycidyl methacrylate-co-butyl acrylate), or various water-dispersible polyesters, water-dispersible polyurethanes, or water-dispersible polyacrylics, as well as sub-micrometer silica particles. The dry thickness of the primer layer can be at least 0.1 µm and up to and including 1 µm.

Thus, with the application of the described reactive composition to a suitable substrate, with or without appropriate drying, the present invention provides a precursor article comprising a substrate and having disposed thereon a polymeric layer comprising the reactive composition described above that comprises the reactive polymer that is metal ion-complexing, water-soluble, and crosslinkable, and optionally, a photosensitizer.

Uses of Reactive Compositions

The reactive compositions described herein can be used to form reactive polymer patterns (or patterns of the reactive compositions) that can be used as described below to form surface conductive patterns for various purposes as described above. The following discussion provides some details about representative electroless plating methods in which the reactive compositions described herein can be used.

In these electroless plating methods, each aqueous-based "processing" solution, dispersion, or bath (for example, solutions containing electroless seed metal ions, reducing agent solutions, and solutions for electroless plating, as well as rinsing solutions) used at various points can be specifically designed with essential components as well as optional addenda that would be readily apparent to one skilled in the art. For example, one or more of those aqueous-based processing solutions can include such addenda as surfactants, anti-coagulants, anti-corrosion agents, anti-foamants, buffers, pH modifiers, biocides, fungicides, and preservatives. The aqueous-based reducing solutions can also include suitable antioxidants.

The method of this invention for forming a pattern in a polymeric layer comprises:

providing a polymeric layer (as in forming the described precursor article), the polymeric layer comprising the reactive composition described above, comprising a reactive polymer as described above, and optionally a photosensitizer. This polymeric layer can be formed on a suitable substrate, if desired, as described above by suitable application of the reactive composition, after which the reactive composition is typically dried before the resulting precursor article is used in the method of this invention.

This polymeric layer in the precursor article, usually in dry form, can be then patternwise exposed to radiation having a $\lambda_{max}$ of at least 150 nm and up to and including 700 nm or to radiation having a $\lambda_{max}$ of at least 150 nm and up to and including 450 nm, to provide a polymeric layer comprising non-exposed regions and exposed regions comprising at least partially crosslinked polymer. This exposure can be provided with any suitable exposing source or device that provides the desired radiation including but not limited to, various arc lamps and LED sources. The particular exposing source can be chosen depending upon the absorption characteristics of the reactive composition used. The exposing radiation can be projected through lenses and mirrors or through a lens or mask element that can be in physical contact or in proximity with the outer surface of the polymeric layer. Exposure time can range from a fraction (0.1) of a second and up to and including 10 minutes depending upon the intensity of the radiation source and the reactive composition. Suitable masks can be obtained by known methods including but not limited to photolithographic methods, flexographic methods, or vacuum deposition of a chrome mask onto a suitable substrate such as quartz or high quality optical glass followed by photolithographic patterning.

It is optional but desirable to heat or bake the polymeric layer in the precursor article simultaneously with or after the patternwise exposure but generally before removing the reactive composition as described below, at a temperature sufficient to further crosslink the at least partially crosslinked in the exposed regions of the polymeric layer. In most embodiments, this heating is carried out at least after the patternwise exposure of the polymeric layer, but it can be carried out both during and after the patternwise exposure of the polymeric layer. Such heating can be accomplished on a hot plate with vacuum suction to hold the precursor article in close contact with the heating surface. Alternatively, the heating device can be a convection oven. The duration of the heating procedure is generally less than 10 minutes with heating for least 10 seconds and up to and including 5 minutes being most likely. The optimal heating time and temperature can be readily determined with routine experimentation depending upon the particular reactive composition.

This results in an intermediate article of this invention comprising a substrate and having disposed thereon a polymeric layer comprising exposed regions and non-exposed regions, the exposed regions comprising a pattern of at least partially crosslinked polymer that has been derived from a reactive polymer that is metal ion-complexing, water-soluble, and crosslinkable, which reactive polymer comprises pendant groups comprising crosslinkable —C(=O)—CR=CR$^1$—Y— or —C(=O)—CR=CR$^1$—Y groups wherein R, R$^1$, and Y are as defined above, and the non-exposed regions comprising a reactive composition that comprises the reactive polymer, and optionally, a photosensitizer as described above.

The polymeric layer is generally hydrophilic in the crosslinked and exposed regions such that immersion in aqueous-based solutions (described below) will allow the aqueous molecules, ions, or reagent molecules to rapidly diffuse into the exposed regions.

After the imagewise exposure and optional heating procedures, the reactive composition comprising the reactive polymer can be removed from the non-exposed regions in the intermediate article so that there is essentially no (less than 20%, and preferably less than 10%, by weight of the original amount) reactive composition remaining on the substrate. This can be done by washing, spraying, or immersing the intermediate article in water, aqueous alkaline solution, or another aqueous solution for a suitable time and temperature to remove most or all of the reactive composition from the non-crosslinked, non-exposed regions of the polymeric layer. Contact with the aqueous solution can be carried out for a suitable time and temperature so that reactive composition is desirably removed in the non-exposed regions but little removal occurs in the exposed regions containing the crosslinked polymer. For example, the contact time can be at least 10 seconds and up to and including 10 minutes, and the contact temperature can be at room temperature (about 20° C.) and up to and including 95° C.

This procedure thus provides another intermediate article of this invention, comprising a substrate and having disposed thereon a polymeric layer comprising exposed regions and non-exposed regions, the exposed regions comprising a pattern of at least partially crosslinked polymer that has been derived from a reactive polymer in a reactive composition as defined above, and the non-exposed regions comprising substantially no reactive composition.

Once the reactive composition has been removed from the non-exposed regions, the exposed regions of the polymeric layer can be contacted with an aqueous-based solution or dispersion of electroless seed metal ions to form a pattern of electroless seed metal ions in the exposed regions of the polymeric layer. There are various ways that this contacting can be carried out. Typically, the entire intermediate article is immersed within a dilute aqueous-based solution, bath, or dispersion of the electroless seed metal ions for a sufficient time to coordinate the optimum number of electroless seed metal ions within the crosslinked polymer that has been derived from the reactive polymer described above. For example, this contact with the electroless seed metal ions can be carried out for at least 1 second and up to and including 30 minutes, at room temperature (about 20° C.) or at a higher temperature of up to and including 95° C. The time and temperature for this contact can be optimized for a given reactive composition and electroless seed metal ions that are to be used.

Representative electroless seed metal ions that can be used in these procedures are selected from the group consisting of silver ions, platinum ions, palladium ions, gold ions, tin ions, rhodium ions, iridium ions, nickel ions, and copper ions. Most noble metal ions can serve as electroless seed metal ions in the present invention. These electroless seed metal ions can be provided in the form of a suitable metal salt or metal-ligand complex (that can have an overall positive, negative, or neutral charge). Useful materials of this type include but are not limited to, metal salts and metal-ligand complexes of nitrates, halides, acetates, cyanides, thiocyanates, amines, nitriles, and sulfates. Thus, the electroless seed metal ions can be provided from simple salts or in the form of metal-ligand complexes. The amount of metal salts or metal-ligand complexes present in the aqueous-based solution would be readily apparent to one skilled in the art and can be optimized for a particular reactive composition and exposure procedure. For example, the metal salts or metal-ligand complexes can be present in the aqueous-based solution in an amount sufficient to provide at least 0.00001 molar and up to and including 2 molar of the desired electroless metal ions. In one embodiment, a 0.4 molar silver nitrate solution can be used at room temperature to provide electroless seed silver ions.

The contact with the electroless seed metal ions produces an intermediate article comprising a substrate and having disposed thereon a polymeric layer comprising exposed regions and non-exposed regions, the exposed regions comprising a pattern of electroless seed metal ions complexed within the at least partially crosslinked polymer derived from a reactive polymer in a reactive composition described above, and the non-exposed regions comprising substantially no electroless seed metal ions or reactive composition as described above.

After the requisite time to react the electroless seed metal ions within the at least partially crosslinked polymer in the exposed regions, the polymeric layer can be rinsed with distilled or deionized water or another aqueous-based solution for a suitable time and at a suitable temperature, for example usually room temperature or slightly higher.

After forming the pattern of electroless seed metal ions, the electroless seed metal ions can be reduced to provide a pattern of the corresponding electroless seed metal nuclei in the exposed regions of the polymeric layer. This can be done by contacting the polymeric layer (or at least the exposed regions) with a suitable reducing agent for the electroless seed metal ions. For example, the intermediate article comprising the polymeric layer can be immersed within an aqueous-based reducing solution containing one or more reducing agents for a suitable time to cause sufficient metal ion reduction. Alternatively, an aqueous-based reducing solution comprising the reducing agent can be sprayed or rolled uniformly onto the polymeric layer.

Useful reducing agents include but are not limited to, an organic borane, an aldehyde such as formaldehyde, aldehyde sugar, hydroquinone, or sugar (or polysaccharide) such as ascorbic acid, and metal ions such as tin(II). These reducing agents can be used individually or in combination, and the total amount in the aqueous-based reducing solution used for the reducing procedure can be at least 0.01 weight % and up to and including 20 weight % based on the total reducing solution weight. The amount of reducing agent to be used will depend upon the particular electroless seed metal ions and reducing agent to be used, and this can be readily optimized using routine experimentation. The time and temperature for the reduction can also be readily optimized in the same manner. Generally, the reducing temperature is at least room temperature (about 20° C.) and up to and including 95° C. and the reducing time can be for at least 1 second and up to and including 30 minutes.

For example, some embodiments of the present invention can be carried out using an immersion bath comprising 1 reducing solution weight % of an organic borane such as dimethylamine borane (DMAB) at room temperature for up to 3 minutes. Longer or shorter times at higher temperatures are possible if needed.

After this reducing procedure, the polymeric layer, especially the exposed regions, can be again washed using distilled water or deionized water or another aqueous-based solution at a suitable temperature for a suitable time.

At this point, the method of this invention has provided yet another intermediate article, comprising a substrate and having disposed thereon a polymeric layer comprising exposed regions and non-exposed regions, the exposed regions comprising a pattern of corresponding electroless seed metal nuclei within the at least partially crosslinked polymer that has been derived from the reactive polymer in the reactive composition described above, and the non-exposed regions comprising substantially no electroless seed metal nuclei or reactive composition as described above.

This intermediate article can be immediately immersed in an aqueous-based electroless metal plating bath or solution, or the intermediate article can be stored with just the catalytic pattern comprising corresponding electroless seed metal nuclei for use at a later time.

The intermediate article can be contacted with an electroless plating metal that is the same as or different from the corresponding electroless seed metal nuclei. In most embodiments, the electroless plating metal is a different metal from the corresponding electroless seed metal nuclei.

Any metal that will likely electrolessly "plate" on the corresponding electroless seed metal nuclei can be used at this point, but in most embodiments, the electroless plating metal can be for example copper(II), silver(I), gold(IV), palladium (II), platinum(II), nickel(II), chromium(II), and combinations thereof. Copper(II), silver(I), and nickel(II) are particularly useful electroless plating metals.

The one or more electroless plating metals can be present in the aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure, the resulting product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of corresponding electroless seed metal nuclei that have been electrolessly plated with the same or different metal within the at least partially crosslinked polymer derived from the reactive polymer in a reactive composition as described above, and the non-exposed regions comprising substantially no electrolessly plated metal or reactive composition as described above.

To change the surface of the electroless plated metal for visual or durability reasons, it is possible that a variety of post-treatments can be employed including surface plating of still at least another (third or more) metal such as nickel or silver on the electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, it may be desirable to treat the electrolessly plated metal with a seed metal catalyst in an aqueous-based seed metal catalyst solution to facilitate deposition of additional metals.

As one skilled in the art should appreciate, the individual treatments or steps described above for this method can be carried out two or more times before proceeding to the next procedure or step. For example, the treatment with the aqueous-based solution containing electroless seed metal ions can be carried out two or more times in sequence, for example, with a rinsing step between sequential treatments. The electroless seed metal ions can be the same or different for the sequential treatments and the treatment conditions can be the same or different.

In addition, multiple treatments with an aqueous-based reducing solution or aqueous-based electroless metal plating solution can be carried out in sequence, using the same or different conditions. Sequential washing or rinsing steps can also be carried out where appropriate.

Further, the electroless plating procedures can be carried out multiple times, in sequence, using the same or different electroless plating metal and the same or different electroless plating conditions.

The reactive polymers and reactive compositions described above can also be used in additional patterning methods described as follows:

Electroless Plating Method 2:

This method can be used to form a pattern in a polymeric layer, the method comprising:

providing a polymeric layer comprising a reactive composition that comprises: (1) a reactive polymer, and (2) optionally, a photosensitizer, as described above, patternwise exposing the polymeric layer to radiation having a $\lambda_{max}$ of at least 150 nm that is sufficient to induce crosslinking within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the exposed regions of the polymeric layer, removing the reactive composition comprising the reactive polymer in the non-exposed regions, incorporating a reducing agent into the exposed regions of the polymeric layer, contacting the exposed regions of the polymeric layer with electroless seed metal ions to oxidize the reducing agent in the exposed regions of the polymeric layer and to form a pattern of electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

The polymeric layer in a precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, as described above.

It is optional but desirable to heat or bake the reactive composition in the precursor article simultaneously with or after the patternwise exposure but generally before contacting the exposed polymeric layer with the aqueous-based reducing solution (described below) and conditions as described above.

Generally immediately after the patternwise exposing or optional heating procedures, the reactive composition in the non-exposed regions of the polymeric layer is removed as described above in prior methods. Upon this removal of reactive composition from the non-exposed regions of the polymeric layer, the various articles described herein will contain crosslinked polymer in the exposed regions of the polymeric layer.

At this point, an intermediate article has been created in which the exposed regions of the polymeric layer on the substrate comprise crosslinked polymer derived from the reactive polymer in the reactive composition as described herein, and the non-exposed regions of the polymeric layer comprise little or no reactive composition (less than 10 weight % of the original amount).

After the exposure and optional heating, the exposed regions of the polymeric layer are contacted with an aqueous-based reducing solution containing one or more reducing agents and conditions, as described above. In the exposed regions, the reducing agent can diffuse into the crosslinked polymer provided during irradiation or the reactive composition described herein. In the non-exposed regions, the reducing agent does not readily diffuse into or attach to the reactive polymer.

After this reducing procedure, the polymeric layer, especially the exposed regions, can be again washed using distilled water or deionized water or another aqueous-based solution at a suitable temperature for a suitable time.

At this point, an intermediate article is provided, which intermediate article comprises a substrate and having disposed thereon a polymeric layer comprising exposed regions and non-exposed regions, the exposed regions comprising a pattern of a crosslinked polymer derived from the reactive polymer in the reactive composition described herein, and comprising reducing agent dispersed within the crosslinked polymer, and the non-exposed regions comprising substantially no reactive composition.

Once the patternwise exposure, optional heating, and contacting with the reducing agent have been carried out, the exposed regions of the polymeric layer can be contacted with an aqueous-based solution or dispersion of electroless seed metal ions to form electroless seed metal nuclei in the exposed regions of the polymeric layer using aqueous-based solutions and conditions as described above. These electroless seed metal nuclei form catalytic sites for electroless metal plating (deposition of metal) described below.

The contact with the electroless seed metal ions produces an intermediate article comprising a substrate and having disposed thereon a polymeric layer comprising exposed regions and non-exposed regions, the exposed regions comprising a pattern of electroless seed metal nuclei within the crosslinked polymer resulting from the irradiation of the reactive polymer in the reactive composition described herein, and the non-exposed regions comprising substantially no reactive composition.

After the requisite time to react within the resulting crosslinked polymer in the exposed regions, the polymeric layer can be rinsed with distilled or deionized water or other aqueous-based solution for a suitable time and at a suitable temperature, usually room temperature or slightly higher.

The resulting intermediate article can be immediately immersed in an aqueous-based electroless plating bath or solution or the immediate article can be stored with the catalytic pattern comprising corresponding electroless seed metal nuclei for use at a later time. The intermediate article can be contacted with an electroless plating metal that is the same as or different from the corresponding electroless seed metal nuclei, using aqueous-based solutions and conditions as described above.

After the electroless plating procedure, a product article is removed from the aqueous-based electroless plating bath and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of an electroless seed metal nuclei (for example, in a pattern) that have been electrolessly plated with the same or different metal, and crosslinked polymer resulting from irradiation of the reactive polymer in the reactive composition described above, and the non-exposed regions comprising substantially no reactive composition.

Electroless Plating Method 3:

This method can be used to form a pattern in a polymeric layer, the method comprising:

providing a polymeric layer comprising a reactive composition that comprises: (1) a reactive polymer, and (2) optionally, a photosensitizer, as described above, patternwise exposing the polymeric layer to radiation having a $\lambda_{max}$ of at least 150 nm that is sufficient to induce crosslinking within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the exposed regions of the polymeric layer, removing the reactive composition comprising the reactive polymer in the non-exposed regions, contacting both the non-exposed regions and the exposed regions of the polymeric layer with a reducing agent, bleaching the polymeric layer to remove surface amounts of the reducing agent in both non-exposed and exposed regions of the polymeric layer, contacting the exposed regions of the polymeric layer with electroless seed metal ions to oxidize the reducing agent and to form a pattern of electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

Thus, in this method including providing a polymeric layer (as in forming the described precursor article), the polymeric layer comprises a reactive composition comprising a reactive polymer and optionally, a photosensitizer, all as described above.

This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, as described above.

It is optional but desirable to heat or bake the reactive composition in the precursor article simultaneously with or after the patternwise exposure but generally before contacting the exposed polymeric layer with electroless seed metal ions (described below), as described above.

Generally immediately after the patternwise exposing or optional heating procedures, the reactive composition remaining in the non-exposed regions of the polymeric layer is removed as described above in previous methods (at least 90 weigh % of the original amount).

At this point, an intermediate article has been created in which the exposed regions of the polymeric layer on the substrate comprise crosslinked polymer derived from the reactive polymer in the reactive composition described above, and the non-exposed regions of the polymeric layer comprise little or no reactive composition.

After the exposure and optional heating, the exposed regions of the polymeric layer are contacted with an aqueous-based reducing solution containing one or more suitable reducing agents using aqueous-based solutions and conditions as described above. In the exposed regions, the reducing agent can diffuse into the crosslinked polymer. In the non-exposed regions, the reducing agent does not readily diffuse into the polymeric layer but will become attached to the surface of the polymeric layer.

After this reducing procedure, the polymeric layer, especially the exposed regions, can be again washed using distilled water or deionized water or another aqueous-based solution at a suitable temperature for a suitable time.

At this point, an intermediate article is provided, which intermediate article comprises a substrate and having disposed thereon a polymeric layer comprising exposed regions and non-exposed regions, the exposed regions comprising a crosslinked polymer derived from the reactive polymer in the reactive composition described above, into which a reducing agent has diffused, and the non-exposed regions comprising substantially no reducing agent and reactive composition (less than 10 weight % of the original amount).

Once patternwise exposure, optional heating, and the reducing procedure have been carried out, the polymeric layer can be contacted with an aqueous-based bleaching (or oxidizing) solution comprising one or more bleaching agents, thereby removing surface amounts of the reducing agent in both non-exposed and exposed regions of the polymeric layer. The term "bleaching" refers to oxidizing the reducing agent molecules to make them inactive for further reaction (thus, they cannot reduce the seedless metal ions when bleached).

Useful bleaching agents for this bleaching procedure can be chosen depending upon the reducing agent that is used in the previous operation. Representative bleaching agents include but are not limited to, peroxides such as hydrogen peroxide, persulfates, iron(III) complexes, and combinations thereof. Hydrogen peroxide is particularly useful. In general, the one or more bleaching agents are present in the aqueous-based bleaching solution in an amount of at least 0.01 weight % and up to and including 20 weight %, based on total aqueous-based bleaching solution weight.

In general, bleaching the polymeric layer is carried out in sufficient time and temperature so that the aqueous-based bleaching solution reacts with (deactivates) or removes at least 90 mol % (or typically at least 95 mol %) of the reducing agent in the non-exposed regions and less than 40 mol % (or typically less than 25 mol %) in the exposed regions of the polymeric layer. The useful time and temperature conditions needed to achieve these results would be readily determined with routine experimentation in view of the teaching provided herein.

At this point, the present invention provides an intermediate article, comprising a substrate and having disposed thereon a polymeric layer comprising exposed regions and non-exposed regions, the exposed regions comprising a pattern of non-oxidized reducing agent molecules within the crosslinked polymer resulting from the irradiation of the reactive polymer in the reactive composition described herein, and the non-exposed regions comprising substantially no reactive composition.

Once the previous operations have been carried out, the exposed regions of the polymeric layer can be contacted with an aqueous-based solution or dispersion containing electroless seed metal ions to oxidize the reducing agent and to form corresponding electroless seed metal nuclei (for example in a pattern) in the exposed regions of the polymeric layer using aqueous-based solutions and conditions as described above. These corresponding electroless seed metal nuclei form catalytic sites for electroless metal plating (deposition of metal) described below.

The contact with the electroless seed metal ions produces an intermediate article comprising a substrate and having disposed thereon a polymeric layer comprising exposed regions and non-exposed regions, the exposed regions comprising a pattern of corresponding electroless seed metal nuclei within the crosslinked polymer resulting from irradiation of the reactive polymer in the reactive composition described herein, and the non-exposed regions comprising substantially no reactive composition.

After the requisite time to react the electroless seed metal ions within the resulting crosslinked polymer in the exposed regions, the polymeric layer can be rinsed with distilled or deionized water or another aqueous-based solution for a suitable time and at a suitable temperature, usually room temperature or slightly higher.

The resulting intermediate article can be immediately immersed in an aqueous-based electroless plating bath or solution or it can be stored with just the catalytic pattern comprising electroless seed metal for use at a later time.

The article can be contacted with an electroless plating metal that is the same as or different from the electroless seed metal using aqueous-based solutions and conditions as described above. In most embodiments, the electroless plating metal is a metal different from the corresponding electroless seed metal nuclei.

After the electroless plating procedure, the product article is removed from the aqueous-based electroless plating bath and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of a corresponding electroless seed metal nuclei within the crosslinked polymer derived from the reactive polymer in the reactive composition described herein, which has been electrolessly plated with the same or different metal, and the non-exposed regions comprising substantially no reactive composition or electroless seed metal nuclei.

Electroless Plating Method 4:

This method can be used to form a pattern in a polymeric layer, the method comprising:

providing a polymeric layer comprising a reactive composition that comprises: (1) a reactive polymer, and (2) optionally, a photosensitizer, as described above, patternwise exposing the polymeric layer to radiation having a $\lambda_{max}$ of at least 150 nm that is sufficient to induce crosslinking within the reactive polymer, to provide a polymeric layer comprising non-exposed regions and first exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the first exposed regions of the polymeric layer, removing the reactive composition comprising the reactive polymer in the non-exposed regions (at least 90 weight % of the original amount), contacting the first exposed regions of the polymeric layer with electroless seed metal ions to form electroless seed metal ions in the first exposed regions of the polymeric layer, contacting the first exposed regions of the polymeric layer with a halide to react with the electroless seed metal ions and to form corresponding electroless seed metal halide in the first exposed regions of the polymeric layer, optionally exposing the polymeric layer to convert at least some of the corresponding electroless seed metal halide in the first exposed regions to corresponding electroless seed metal nuclei and to form second exposed regions in the polymeric layer, optionally contacting the polymeric layer with a reducing agent either: (i) to develop the corresponding electroless seed metal image in the second exposed regions of the polymeric layer, or (ii) to develop all of the corresponding electroless seed metal halide in the first exposed regions, optionally contacting the polymeric layer with a fixing agent to remove any remaining corresponding electroless seed metal halide in either the first exposed regions, the second exposed regions, or both of the first exposed regions and the second exposed regions, and electrolessly plating the corresponding electroless seed metal nuclei in the first exposed regions, the second exposed regions, or both the first exposed regions and the second exposed regions, of the polymeric layer with a metal that is the same as or different from the corresponding electroless seed metal nuclei.

Such method is carried out by providing a polymeric layer (as in forming the described precursor article), the polymeric layer comprising the reactive composition described above. This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, as described above to provide a polymeric layer comprising non-exposed regions and first exposed regions comprising a crosslinked polymer.

It is optional but desirable to heat or bake the reactive composition in the precursor article simultaneously with or after the patternwise exposure but generally before contacting the exposed polymeric layer with electroless seed metal ions (described below), as described above.

Generally immediately after the patternwise exposing or optional heating procedures, the reactive composition remaining in the non-exposed regions of the polymeric layer is removed as described above for other methods (at least 90 weight % of the original amount). Upon this removal of reactive composition from the non-exposed regions of the polymeric layer, the various articles described herein will contain crosslinked polymer in the exposed regions of the polymeric layer.

At this point, an intermediate article has been created in which the first exposed regions of the polymeric layer on the substrate comprise crosslinked polymer derived from the reactive polymer in the reactive composition described above, and the non-exposed regions of the polymeric layer comprise substantially no reactive composition.

Once patternwise exposure and optional heating have been carried out, the first exposed regions of the polymeric layer are contacted with electroless seed metal ions to form coordinated electroless seed metal ions in the first exposed regions of the polymeric layer using aqueous-based solutions and conditions described above.

The contact with the electroless seed metal ions produces an intermediate article comprising a substrate and having disposed thereon a polymeric layer comprising first exposed regions and non-exposed regions, the first exposed regions comprising a pattern of electroless seed metal ions within the crosslinked polymer resulting from irradiation of the reactive polymer in the reactive composition described above, and the non-exposed regions comprising substantially no reactive composition.

After the requisite time to react the electroless seed metal ions within the crosslinked polymer in the first exposed regions, the polymeric layer can be rinsed with distilled or deionized water or another aqueous-based solution for a suitable time and at a suitable temperature, usually room temperature or slightly higher.

At least the first exposed regions of the polymeric layer are then contacted with a halide that reacts with the seed metal ions to form corresponding electroless seed metal halide in the first exposed regions of the polymeric layer. Halides can be provided as suitable halide salts to provide iodide ions, chloride ions, or bromide ions or a combination of two or more of these halides to form electroless seed metal halide in the first exposed regions of the polymeric layer. Chloride ions, iodide ions, or bromide ions or mixtures thereof are particularly useful.

This contacting with a halide can be carried out by immersing the intermediate article described above within an aqueous-based halide bath or halide solution of a suitable halide salt, or the aqueous-based halide solution can be sprayed or coated onto the polymeric layer in a uniform or patternwise manner. The time for this halide treatment can be at least 1 second and up to and including 30 minutes, and the temperature for the halide treatment can be room temperature (about 20° C.) and up to and including 95° C. The time and temperature and the type and amount of halide in a treatment bath can be optimized in order to provide the sufficient amount of corresponding electroless seed metal halide in the first exposed regions of the polymeric layer.

At this point, an intermediate article has been created, which intermediate article comprises a substrate and having thereon a polymeric layer comprising first exposed regions and non-exposed regions, the first exposed regions of the polymeric layer comprising a pattern of corresponding electroless seed metal halide in the crosslinked polymer derived from the reactive polymer in the reactive composition described above, and the non-exposed regions comprising substantially no reactive composition.

After this halide treatment, the polymeric layer can be optionally exposed again to convert at least some, or typically at least 20% (or more typically at least 50%), of the corresponding electroless seed metal halide in first exposed regions of the polymeric layer to corresponding electroless seed metal nuclei using radiation having a $\lambda_{max}$ of at least 150 nm and up to and including 450 nm, or more likely having a $\lambda_{max}$ of at least 240 nm and up to and including 450 nm. The second exposed regions can be the same as or different from the first exposed regions, or the first and second exposed regions can partially overlap.

With this second exposure, the method can provide yet another intermediate article comprising a substrate and having disposed thereon a polymeric layer comprising first exposed regions, second exposed regions, and non-exposed regions, the first exposed regions comprising corresponding electroless seed metal halide in the crosslinked polymer derived from the reactive polymer in the reactive composition described above, the second exposed regions comprising a pattern of corresponding electroless seed metal with a latent image in the crosslinked polymer derived from the reactive polymer in the reactive composition described above, and the non-exposed regions comprising substantially no reactive composition as described above.

The polymeric layer comprising corresponding electroless seed metal halide in the first exposed regions, or corresponding electroless seed metal latent image in the second exposed regions, or both corresponding electroless seed metal halide in the first exposed regions and corresponding electroless seed metal latent image in the second exposed regions are then optionally contacted with a suitable aqueous-based reducing solution comprising one or more reducing agents using aqueous-based solutions and conditions as described above.

After this reducing procedure, the polymeric layer, especially the first exposed regions or the second exposed regions, can be again washed using distilled water or deionized water or another aqueous-based solution for a suitable time to remove excess reducing agent.

The reducing procedure can provide another intermediate article that comprises a substrate and having thereon a polymeric layer comprising first exposed regions, second exposed regions, and non-exposed regions, the first exposed regions of the polymeric layer comprising a pattern of corresponding electroless seed metal halide in a crosslinked polymer derived from the reactive polymer in the reactive composition described above, the second exposed regions of the polymeric layer comprising a pattern of corresponding electroless seed metal nuclei in the crosslinked polymer derived from the reactive polymer in the reactive composition described above, and the non-exposed regions of the polymeric layer comprising substantially no reactive composition.

The polymeric layer comprising corresponding electroless seed metal halide in the first exposed regions, or corresponding electroless seed metal nuclei in the second exposed regions, or both corresponding electroless seed metal halide in the first exposed regions and corresponding electroless seed metal nuclei in the second exposed regions, are then optionally contacted with a suitable fixing agent. This contact removes any remaining corresponding electroless seed metal halide from both the first exposed regions and the second exposed regions of the polymeric layer, while leaving behind any corresponding electroless seed metal nuclei in the second exposed regions.

This contact with a fixing agent can be done by immersing the polymeric layer (or at least the first and second exposed regions) within an aqueous-based fixing solution containing one or more fixing agents for a suitable time to cause the desired change (removal of the corresponding electroless metal halide) in the first exposed regions and the second exposed regions. Alternatively, an aqueous-based fixing solution can be sprayed or rolled uniformly onto the polymeric layer to accomplish the same results.

Useful fixing agents include but are not limited to, sulfites, thiocyanates, thiosulfates, thioureas, halides, ammonia, chelates such as ethylenediaminetetracetic acid, and mixtures thereof. Fixing accelerators can also be included in the aqueous-based fixing solutions, which compounds include, but are not limited to, thioethers and mercaptotriazoles. The fixing agents can be present as salts (that is alkali metal or ammonium salts) as is well known in the art, for instance as described in *Research Disclosure* December 1978 publication 38957. The total amount of fixing agents in the aqueous-based fixing solution can be at least 0.01 weight % and up to and including 50 weight % based on total fixing solution weight. The fixing agent amount can be readily optimized using routine experimentation. The fixing time and temperature can also be readily optimized in the same manner. Generally, the fixing temperature is at least room temperature (about 20° C.) and up to and including 99° C. and the reducing time can be for at least 1 second and up to and including 30 minutes.

For example, some embodiments of the present invention can be carried out using an aqueous-based fixing solution comprising 20 solution weight % of sodium thiosulfate in combination with 1.5 solution weight % of sodium sulfite at room temperature for 3 minutes. Longer or shorter times at higher temperatures are possible.

After this fixing procedure, the polymeric layer, especially the first exposed regions or the second exposed regions, can be again washed using distilled water or deionized water or another aqueous-based solution for a suitable time to remove excess fixing agent.

The fixing procedure can provide another intermediate article that comprises a substrate and having thereon a polymeric layer comprising first exposed regions, second exposed regions, and non-exposed regions, the first exposed regions of the polymeric layer from which the pattern of corresponding electroless seed metal halide has been removed, the first exposed regions comprising the crosslinked polymer being derived from a reactive polymer in a reactive composition as described above, the second exposed regions of the polymeric layer comprising a pattern of corresponding electroless seed metal nuclei in the crosslinked polymer being derived from a reactive polymer in a reactive composition as described above, and the non-exposed regions of the polymeric layer comprising substantially no reactive composition.

The intermediate article that has been treated as described above can be immediately immersed in an aqueous-based electroless metal plating bath or solution using conditions and aqueous-based solutions described above, or the treated article can be stored with just the catalytic pattern comprising corresponding electroless seed metal nuclei for use at a later time.

After the electroless plating procedure, the product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising first exposed regions (and optional second exposed regions) and non-exposed regions, the first exposed regions comprising a pattern of corresponding electroless seed metal nuclei that have been electrolessly plated with the same or different metal in a crosslinked polymer derived from the a reactive polymer in the reactive composition described herein, and the non-exposed regions comprising substantially no reactive composition.

Electroless Plating Method 5:

This method can be used to form a pattern in a polymeric layer, the method comprising:

providing a polymeric layer comprising a reactive composition that comprises: (1) a reactive polymer, and (2) optionally, a photosensitizer, as described above, patternwise exposing the polymeric layer to radiation having a $\lambda_{max}$ of at least 150 nm that is sufficient to induce crosslinking within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the exposed regions of the polymeric layer, removing the reactive composition comprising the reactive polymer in the non-exposed regions (at least 90 weight % of the original amount), contacting the exposed regions of the polymeric layer with electroless seed metal ions to form a pattern of electroless seed metal ions in the exposed regions of the polymeric layer, optionally contacting the pattern of electroless seed metal ions in the exposed regions of the polymeric layer with a non-reducing reagent that reacts with the electroless seed metal ions to form an electroless seed metal compound that has a $K_{sp}$ of less than 40, and electrolessly plating the electroless seed metal compound within the exposed regions of the polymeric layer with a metal that is the same as or different from the corresponding electroless seed metal compound.

Such method thus comprises providing a polymeric layer (as in forming the described precursor article), the polymeric layer comprising a reactive composition as described above comprising a reactive polymer and optionally, a photosensitizer.

This polymeric layer in the precursor article, usually in dry form, can be then patternwise exposed as described above to radiation having a $\lambda_{max}$ of at least 150 nm and up to and including 450 nm or to radiation having a $\lambda_{max}$ of at least 150 nm and up to and including 330 nm, to provide a polymeric layer comprising non-exposed regions and exposed regions comprising a crosslinked polymer.

It is optional but desirable to heat or bake the polymeric layer in the precursor article simultaneously with or after the patternwise exposure but generally before contacting the exposed polymeric layer with electroless seed metal ions (described below) using conditions described above.

Generally, immediately after the patternwise exposing or optional heating procedures, the reactive composition remaining in the non-exposed regions of the polymeric layer is removed as described above for previous methods.

At this point, an intermediate article has been created in which the exposed regions of the polymeric layer on the substrate comprise crosslinked polymer derived from the reactive polymer in the reactive composition described above, and the non-exposed regions of the polymeric layer comprise substantially reactive composition.

Then, the exposed regions of the polymeric layer are contacted with electroless seed metal ions to form coordinated electroless seed metal ions in the exposed regions of the polymeric layer using aqueous-based solutions and conditions as described above.

The contact with the electroless seed metal ions produces an intermediate article comprising a substrate and having disposed thereon a polymeric layer comprising exposed regions and non-exposed regions, the exposed regions comprising a pattern of electroless seed metal ions within the crosslinked polymer resulting from the irradiation of the reactive polymer in the reactive composition described herein, and the non-exposed regions comprise substantially no reactive composition.

After the requisite time to react the electroless seed metal ions within the crosslinked polymer in the exposed regions, the polymeric layer can be rinsed with distilled or deionized water or another aqueous-based solution for a suitable time and at a suitable temperature, for example usually room temperature or slightly higher.

The electroless seed metal ions in the exposed regions of the polymeric layer are then contacted with a non-reducing reagent that reacts with the electroless seed metal ions to form an electroless seed metal compound (containing the non-reducing reagent) deposited within the exposed regions of the polymeric layer containing the crosslinked polymer derived from the reactive polymer in the reactive composition described above.

Useful non-reducing reagents include any compound that will covalently, ionically, or otherwise bond to or react with the electroless seed metal ions to form the electroless seed metal compound. Useful non-reducing reagents include those that provide electroless seed metal compounds having a $pK_{sp}$ value of less than 40, and for example, a $pK_{sp}$ that is greater than 4 and less than 40. For example, such useful non-reducing reagents include but are not limited to, alkali metal and ammonium hydroxides, thiosulfates, thiocyanates, sulfites, small organic acids, and combinations thereof. Halides are also useful non-reducing reagents for this invention. Alkali metal hydroxides are particularly useful including mixtures thereof.

This contacting procedure can be carried out in various ways including immersing the intermediate article in an aqueous-based non-reducing solution comprising one or more non-reducing reagents at a concentration of at least 1 weight % based on total aqueous-based non-reducing solution weight. Alternatively, an aqueous-based non-reducing solution can be sprayed or coated onto the polymeric layer in the intermediate article. The time and temperature for this contacting would be readily apparent to one skilled in the art in order to best achieve the desired bonding. For example, the contacting can be carried out at room temperature (about 20° C.) and up to and including 95° C. and the time can be for at least 1 second and up to and including 30 minutes.

After this contact with the non-reducing reagent, the polymeric layer, especially the exposed regions, can be again washed using distilled water or deionized water or another aqueous-based solution under suitable conditions of time and temperature.

At this stage, another intermediate article has been created, which intermediate article comprises a substrate and having disposed thereon a polymeric layer comprising exposed regions and non-exposed regions, the exposed regions of the polymeric layer comprising a pattern of an electroless seed metal compound (comprising a non-reducing reagent as described above) and a crosslinked polymer derived from the reactive polymer in the reactive composition described above, wherein the electroless seed metal compound has a $pK_{sp}$ of less than 40, and the non-exposed regions comprise substantially no reactive composition.

This intermediate article can be immediately immersed in an aqueous-based electroless metal plating bath or solution, or the intermediate article can be stored with just the catalytic pattern comprising electroless seed metal compound for use at a later time.

The intermediate article can be contacted with an electroless plating metal that is the same as or different from the metal within the electroless seed metal compound using the aqueous-based solutions and conditions described above. In most embodiments, the electroless plating metal is a different metal from the metal within the electroless seed metal compound.

After the electroless plating procedure, the product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of an electroless seed metal compound (comprising a non-reducing reagent as described above) which has been electrolessly plated with the same or different metal that is part of the electroless seed metal compound within a crosslinked polymer derived from the reactive polymer in the reactive composition described above, and the non-exposed regions comprising substantially no reactive composition.

The present invention provides at least the following embodiments and combinations thereof, but other combinations of features are considered to be within the present invention as a skilled artisan would appreciate from the teaching of this disclosure:

1. A method for forming a pattern in a polymeric layer, the method comprising:

providing a polymeric layer comprising a reactive composition that comprises: (1) a reactive polymer that is metal ion-complexing, water-soluble, and crosslinkable, which reactive polymer comprises pendant groups comprising crosslinkable —C(=O)—CR=CR$^1$—Y— groups wherein R and R$^1$ are independently hydrogen or an alkyl group having 1 to 6 carbon atoms, a 5- to 6-membered cycloalkyl group, an alkoxy group having 1 to 6 carbon atoms, a phenyl group, or a phenoxy group, and Y is a substituted or unsubstituted aryl or aromatic heterocyclic ring, and (2) optionally, a photosensitizer, patternwise exposing the polymeric layer to radiation having a $\lambda_{max}$ of at least 150 nm that is sufficient to induce crosslinking within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the exposed regions of the polymeric layer, removing the reactive composition comprising the reactive polymer in the non-exposed regions, contacting the exposed regions of the polymeric layer with electroless seed metal ions to form a pattern of electroless seed metal ions in the exposed regions of the polymeric layer, reducing the pattern of electroless seed metal ions to provide a pattern of corresponding electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

2. The method of embodiment 1, wherein the reactive composition further comprises a photosensitizer in the polymeric layer in an amount of at least 0.1 weight % based on the total solids in the polymeric layer, which photosensitizer provides sensitization at a $\lambda_{max}$ of at least 150 nm and up to and including 700 nm.

3. The method of embodiment 1 or 2, further comprising:

heating the polymeric layer after patternwise exposing the polymeric layer but before removing the reactive composition comprising the reactive polymer in the non-exposed regions, at a temperature sufficient to further crosslink the at least partially crosslinked polymer in the exposed regions of the polymeric layer.

4. The method of any of embodiments 1 to 3, comprising contacting the exposed regions in the polymeric layer with electroless seed metal ions selected from the groups consisting of silver ions, platinum ions, palladium ions, gold ions, rhodium ions, nickel ions, iridium ions, tin ions, and copper ions.

5. The method of any of embodiments 1 to 4, comprising electrolessly plating with a metal that is selected from the group consisting of copper(II), silver(I), gold(IV), palladium (II), platinum(II), nickel(II), chromium(II), and combinations thereof.

6. The method of any of embodiments 1 to 5, comprising patternwise exposing the polymeric layer to radiation having a $\lambda_{max}$ of at least 150 nm and up to and including 450 nm.

7. The method of any of embodiments 1 to 6, comprising reducing the electroless seed metal ions in the exposed regions of the polymeric layer with a reducing agent that is a borane, aldehyde, hydroquinone, or sugar reducing agent.

8. A precursor article prepared carrying out any of embodiments 1 to 7, the precursor article comprising a substrate and having disposed thereon a polymeric layer comprising a reactive composition that comprises:

(1) a reactive polymer that is metal ion-complexing, water-soluble, and crosslinkable, which reactive polymer comprises pendant groups comprising crosslinkable —C(=O)—CR=CR$^1$—Y— groups wherein R and R$^1$ are independently hydrogen or an alkyl group having 1 to 6 carbon atoms, a 5- to 6-membered cycloalkyl group, an alkoxy group having 1 to 6 carbon atoms, a phenyl group, or a phenoxy group, and Y is a substituted or unsubstituted aryl or aromatic heterocyclic ring, and (2) optionally, a photosensitizer.

9. An intermediate article obtained during the practice of any of embodiments 1 to 7, the intermediate article comprising a substrate and having disposed thereon a polymeric layer comprising exposed regions and non-exposed regions, the exposed regions comprising a pattern of at least partially crosslinked polymer that has been derived from a reactive polymer that is metal ion-complexing, water-soluble, and crosslinkable, which reactive polymer comprises pendant groups comprising crosslinkable —C(=O)—CR=CR$^1$—Y— groups wherein R and R$^1$ are independently hydrogen or an alkyl group having 1 to 6 carbon atoms, a 5- to 6-membered cycloalkyl group, an alkoxy group having 1 to 6 carbon atoms, a phenyl group, or a phenoxy group, and Y is a substituted or unsubstituted aryl or aromatic heterocyclic ring, and the non-exposed regions comprising a reactive composition that comprises the reactive polymer that is metal ion-complexing, water-soluble, and crosslinkable, and optionally, a photosensitizer.

10. An intermediate article obtained during the practice of any of embodiments 1 to 7, the intermediate article comprising a substrate and having disposed thereon a polymeric layer comprising exposed regions and non-exposed regions, the exposed regions comprising a pattern of at least partially crosslinked polymer that has been derived from a reactive polymer that is metal ion-complexing, water-soluble, and crosslinkable, which reactive polymer comprises pendant groups comprising crosslinkable —C(=O)—CR=CR$^1$—Y— groups wherein R and R$^1$ are independently hydrogen or an alkyl group having 1 to 6 carbon atoms, a 5- to 6-membered cycloalkyl group, an alkoxy group having 1 to 6 carbon atoms, a phenyl group, or a phenoxy group, and Y is a substituted or unsubstituted aryl or aromatic heterocyclic ring, and the non-exposed regions comprising none of the reactive polymer that is metal ion-complexing, water-soluble, and crosslinkable.

11. An intermediate article obtained during the practice of any of embodiments 1 to 7, the intermediate article comprising a substrate and having disposed thereon a polymeric layer comprising exposed regions and non-exposed regions, the exposed regions comprising a pattern of electroless seed metal ions complexed within an at least partially crosslinked polymer that has been derived from a reactive polymer that is metal ion-complexing, water-soluble, and crosslinkable, which reactive polymer comprises pendant groups comprising crosslinkable —C(=O)—CR=CR$^1$—Y— groups wherein R and R$^1$ are independently hydrogen or an alkyl group having 1 to 6 carbon atoms, a 5- to 6-membered cycloalkyl group, an alkoxy group having 1 to 6 carbon atoms, a phenyl group, or a phenoxy group, and Y is a substituted or unsubstituted aryl or aromatic heterocyclic ring, and the non-exposed regions comprising none of the electroless seed metal ions or the reactive polymer that is metal ion-complexing, water-soluble, and crosslinkable.

12. An intermediate article obtained during the practice of any of embodiments 1 to 7, the intermediate article comprising a substrate and having disposed thereon a polymeric layer comprising exposed regions and non-exposed regions, the exposed regions comprising a pattern of electroless seed metal nuclei complexed within an at least partially crosslinked polymer that has been derived from a reactive polymer that is metal ion-complexing, water-soluble, and crosslinkable, which reactive polymer comprises pendant groups comprising crosslinkable —C(=O)—CR=CR$^1$—Y— groups wherein R and R$^1$ are independently hydrogen or an alkyl group having 1 to 6 carbon atoms, a 5- to 6-membered cycloalkyl group, an alkoxy group having 1 to 6 carbon atoms, a phenyl group, or a phenoxy group, and Y is a substituted or unsubstituted aryl or aromatic heterocyclic ring, and the non-exposed regions comprising none of the electroless seed metal nuclei or the reactive polymer that is metal ion-complexing, water-soluble, and crosslinkable.

13. A product article obtained during the practice of any of embodiments 1 to 7, the product article comprising a substrate and having disposed thereon a polymeric layer comprising exposed regions and non-exposed regions, the exposed regions comprising a pattern of electrolessly plated metal complexed within or deposited on the surface of an at least partially crosslinked polymer that has been derived from a reactive polymer that is metal ion-complexing, water-soluble, and crosslinkable, which reactive polymer comprises pendant groups comprising crosslinkable —C(=O)—CR=CR$^1$—Y— groups wherein R and R$^1$ are independently hydrogen or an alkyl group having 1 to 6 carbon atoms, a 5- to 6-membered cycloalkyl group, an alkoxy group having 1 to 6 carbon atoms, a phenyl group, or a phenoxy group, and Y is a substituted or unsubstituted aryl or aromatic heterocyclic ring, and the non-exposed regions comprising none of the electrolessly plated metal or the reactive polymer that is metal ion-complexing, water-soluble, and crosslinkable.

14. Any of embodiments 1 to 13, wherein the reactive polymer comprises a backbone and arranged in any order along the backbone:

—A— recurring units comprising the crosslinkable —C(=O)—CR=CR$^1$—Y groups, and —B— recurring units comprising pendant metal ion-complexing and water-solubilizing groups, wherein the —A— recurring units are present in an amount of at least 2 mol % and up to and including 50 mol %, and the —B— recurring units are present in an amount of at least 50 mol % and up to and including 98 mol %, both based on the total recurring units in the reactive polymer.

15. Embodiment 14, wherein the —B— recurring units comprise pendant carboxylic acid, carboxylate, sulfonic acid, or sulfonate groups.

16. Embodiment 14 of 15, wherein the reactive polymer comprises at least 10 mol % and up to and including 40 mol % of —A— recurring units comprising the crosslinkable —C(=O)—CR=CR$^1$-phenyl groups wherein R and R$^1$ are independently hydrogen or a methyl, ethyl, or phenyl group, based on the total recurring units in the reactive polymer, and at least 60 mol % and up to and including 90 mol % of —B— recurring units.

17. Any of embodiments 14 to 16, wherein the reactive polymer further comprises one or more additional —C— recurring units that are different from all —A— and —B— recurring units, the one or more additional —C— recurring units being present in an amount of up to and including 20 mol % based on the total reactive polymer recurring units.

18. Any of embodiments 1 to 17, wherein the reactive polymer is present in an amount of at least 50 weight % and up to 100 weight % of the total dry weight of the polymeric layer.

Preparation of 2-Cinnamoylethyl Methacrylate Monomer

Into a 250 ml, 3 neck round bottom flask equipped with a condenser and magnetic stirring bar, were added 2-hydroxyethyl methacrylate, (11.30 g, 0.0868 mole) (Mw=130.14 g/mole), toluene (60 g), and triethylamine (Mw=101.19 g/mole) (8.50 g, 0.084 mole). The resulting homogenous solution was stirred and lowered into a pre-heated oil bath set at 55° C. A solution of cinnamoyl chloride (Mw=166.6 g/mole) (13.33 g, 0.080 mole) dissolved in toluene (30 g) was slowly added dropwise over 156 minutes. After this addition, the reaction mixture was stirred for 1 hour, cooled, removed from the oil bath, and the amine hydrochloride precipitate that was formed during the reaction was filtered off. The filtered solution was washed twice with sodium bicarbonate, washed twice with distilled water, washed twice with dilute hydrochloric acid solution, and then washed twice with distilled water. It was then placed over magnesium sulfate for 30 minutes and filtered. The toluene was rotovaporated off and placed under high vacuum at room temperature overnight to remove any residual toluene. The final product was a clear oil with a yellow tint with a Mw=260.29 g/mole and purity was confirmed by NMR.

Preparation of Polymer A: Copolymer Derived from Methacrylic Acid and 2-Cinnamoylethyl Methacrylate in a 90:10 Nominal Molar Ratio The 2-cinnamoylethyl methacrylate monomer was prepared by reacting 2-hydroxyethyl methacrylate with cinnamoyl chloride in the presence of triethylamine to neutralize the hydrochloric acid byproduct using known conditions and starting materials.

Polymer A was prepared using a mixture of 90 mol % methacrylic acid and 10 mol % 2-cinnamoylethyl methacrylate dissolved in toluene using 2,2'-azodi(2-methylbutyronitrile) (AMBN) as the polymerization initiator. The reaction mixture was heated at 65° C. for 18 hours. The resulting reactive polymer was extracted into water containing sodium hydroxide at a molar equivalent to the amount of methacrylic acid monomer put into the reaction. A 6.3 weight % aqueous polymer solution was obtained with the resulting Polymer A that was determined to have a weight average molecular weight of about 850,000 by size exclusion chromatography.

Preparation of Polymer B: Alternative Preparation of Copolymer Derived from Methacrylic Acid and 2-Cinnamoylethyl Methacrylate in a 90:10 Nominal Molar Ratio The following were placed into a 100 ml, single neck round bottom flask: methacrylic acid (2.34 g, 0.02718 mole), 2-cinnamoylethyl methacrylate monomer (0.78 g, 0.00299 mole), 2,2'-azobis(2-methylbutyronitrile) AMBN initiator (0.03 g, 1 weight % based on total solids), and methyl ethyl ketone (MEK)/isopropyl alcohol (IPA) at a 50/50 volume ratio (12.48 g, 20% solids). The reaction mixture was purged with nitrogen for 30 minutes and then placed in a pre-heated oil bath set at 75° C. for 16 hours while stirring with a magnetic stirring bar. The cooled reaction solution was then precipitated into acetone and the precipitate was washed several times with acetone with the resulting white solid material placed in a 40° C. vacuum oven overnight. The solid material was then weighed (2.80 g, 90% yield) and the product was neutralized with enough 2 weight % sodium hydroxide solution to neutralize 50% of the methacrylic acid and the final solution was delivered at 5% solids. The weight average molecular weight of the resulting Polymer B was determined to be 182,000 by size exclusion chromatography.

Preparation of Polymer C: Copolymer Derived from Methacrylic Acid and 2-Cinnamoyl-Ethyl Methacrylate in an 80:20 Nominal Molar Ratio This preparation was identical to that used to prepare Copolymer B except that the monomer nominal molar ratio was adjusted to give a polymer containing 20 mol % of recurring units derived from 2-cinnamoylethyl methacrylate. The weight average molecular weight of the resulting Polymer C was determined to be 130,000 by size exclusion chromatography.

Preparation of Polymer D: Copolymer Derived from Methacrylic Acid and 2-Cinnamoyl-Ethyl Methacrylate in a 70:30 Nominal Molar Ratio This preparation was identical to that used to prepare Polymer B except that the monomer nominal molar ratio was adjusted to give a polymer containing 30 mol % of recurring units derived from 2-cinnamoylethyl methacrylate. The methacrylic acid was neutralized at 100% with 2% sodium hydroxide. The weight average molecular weight of the resulting Polymer D was determined to be 81,900 by size exclusion chromatography.

Preparation of Polymer E: Copolymer Derived from Methacrylic Acid and 2-Cinnamoyl-Ethyl Methacrylate in a 60:40 Nominal Molar Ratio This preparation was identical to that used to prepare Polymer B except that the monomer nominal molar ratio was adjusted to give a polymer containing 40 mol % of recurring units derived from 2-cinnamoylethyl methacrylate. The methacrylic acid was neutralized at 100% with 2% sodium hydroxide. The weight average molecular weight of the resulting Polymer E was determined to be 61,800 by size exclusion chromatography.

Preparation of Polymer F: Copolymer Derived from Methacrylic Acid and 2-Cinnamoyl-Ethyl Methacrylate in a 50:50 Nominal Molar Ratio This preparation was identical to that used to prepare Polymer B except that the monomer nominal molar ratio was adjusted to give a polymer containing 50 mol % of recurring units derived from 2-cinnamoylethyl methacrylate. The methacrylic acid was neutralized at 100% with 2% sodium hydroxide. The weight average molecular weight of the resulting Polymer F was determined to be 87,900 by size exclusion chromatography.

Preparation of Polymer G: Terpolymer Derived from Methacrylic Acid, 2-Cinnamoyl-Ethyl Methacrylate, and Butyl Methacrylate in a 70:20:10 Nominal Molar Ratio The following materials were put into a 100 ml, single neck round bottom flask: methacrylic acid (2.05 g, 0.0238 mole), 2-cinnamoylethyl methacrylate monomer (1.77 g, 0.0068 mole), butyl methacrylate (0.48 g, 0.0034 mole) 2,2'-azobis (2-methylbutyronitrile) AMBN initiator (0.043 g, 1 weight % based on total solids), and MEK/IPA at a 50/50 volume ratio (17.2 g, 20% solids). The reaction solution was purged with nitrogen for 30 minutes and then placed in a pre-heated oil bath set at 75° C. for 16 hours with stirring using a magnetic stirring bar. The cooled solution was then precipitated into heptane and the precipitate was washed several times with heptane with the resulting white solid material placed in a 50° C. vacuum oven overnight. The solid was then weighed (3.40 g, 79% yield), the product was neutralized with enough 2% sodium hydroxide solution to neutralize 100% of the methacrylic acid, and the final solution was delivered at 5% solids

Preparation of the Electroless Copper(II) Plating Bath

The following components were dissolved inside a glass container that had been pre-cleaned with concentrated nitric acid followed by a thorough rinse with distilled water to eliminate any trace of metal on the glass: 1.8 g of copper(II) sulfate pentahydrate, 6.25 g of tetrasodium EDTA (ethylenediaminetetraacetic acid) tetrahydrate, 0.005 g of potassium ferrocyanide trihydrate, 2.25 g of a 37 weight % formaldehyde solution, 80 g of distilled water, and 2 to 3 g of a 45 weight % sodium hydroxide solution to adjust the aqueous-based solution pH to 12.8.

Preparation of the Electroless Nickel(II) Plating Bath

The following components were dissolved inside a glass contained that was pre-cleaned with concentrated nitric acid followed by a thorough rinse with distilled water to eliminate any trace of metal on the glass. 0.36 g of nickel(II) sulfate hexahydrate, 3.37 g of an 85% lactic acid solution, 1.42 g of glacial acetic acid, 0.26 g of propionic acid, 0.25 ppm of thiourea in a 100 ppm methanol solution, 2.835 g of a 14 molar ammonium hydroxide, 78.24 g of distilled water, and about 1.8 g of sodium hypophosphite partial hydrate (assume 95% anhydrous) added immediately before use.

Invention Example 1

Forming Conductive Conner Pattern

A 6.3 weight % aqueous reactive composition obtained from the reactive Polymer A preparation described above was diluted with water to 5 weight % polymer and spin coated as a reactive composition at 4000 RPM onto a PET [poly(ethylene terephthalate)] film substrate having a polymeric adhesion layer of a copolymer derived from glycidyl methacrylate and butyl acrylate that had been applied before stretching the PET film, to provide a polymeric layer on precursor articles.

Each precursor article was imagewise exposed to broadband ultraviolet light through a chrome-on-quartz contact mask for 240 seconds. Some exposed precursor articles were left at room temperature for about 24 hours while other exposed precursor articles were immediately contacted with a vacuum hot plate at 120° C. for 60 seconds (heating procedure).

Following this treatment at either room temperature or on the hotplate, the exposed precursors were then immersed in well agitated distilled water for up to 10 minutes to wash off the reactive composition in the non-exposed regions. Some of the resulting intermediate articles were then allowed to air dry while intermediate articles were immediately immersed in the silver nitrate bath described below.

All washed intermediate articles, whether air-dried or not were immersed within an aqueous-based 0.4 molar silver nitrate solution containing electroless seed silver ions for 2 minutes, rinsed in distilled water, and then immersed in a 1 weight % aqueous-based dimethylamine borane (DMAB) reducing bath for 1 minute, followed by a distilled water rinse.

These resulting intermediate articles were then immersed in the electroless copper(II) plating bath described above for 5 minutes. A brilliant continuous copper film was formed in all UV-exposed regions of the polymeric layers on the substrate. In the resulting copper pattern, line widths of 5 to 6 µm diameter were faithfully reproduced and exhibited high conductivity.

Invention Examples 2-6

Use of Various Reactive Polymers

Precursor articles were prepared using reactive Polymers C, D, E, F, and G in the reactive composition and by spin coating 5 weight % of each reactive polymer preparation containing 0.1 weight % of Dupont Capstone FS-35 surfactant onto the PET substrate as described in Invention Example 1. Each precursor article containing the respective polymeric layer was imagewise exposed using a 1000 watt UV light source filtered through a 350 nm to 450 nm bandpass dichroic mirror for a time series of 8 to 60 seconds. Each exposed polymeric layer was then heated to 60° C. for 1 minute, washed with agitated distilled water for 2 minutes to remove the non-exposed reactive composition, immersed in a 0.4 molar silver nitrate bath for 1 minute, rinsed in distilled water, immersed in a 1 weight % aqueous-based dimethylamine borane (DMAB) reducing bath for 30 seconds, rinsed again with distilled water, and immersed in the electroless copper (II) plating bath described above for 6 minutes followed by a final rinse and air drying.

Conductive copper patterns were formed in each product article using each of the reactive polymers. Reactive polymers containing higher levels of recurring units containing crosslinkable cinnamoyl groups (embodiments of the —A— recurring units defined herein) inhibited copper plating at long exposure times but desirable conductive patterns with shorter exposure times.

Invention Example 7

Forming Nickel Conductive Pattern

A precursor article was prepared using reactive Polymer C and imagewise exposed to UV radiation as described in Invention Example 2. Non-exposed reactive composition (non-exposed regions) was then removed from the substrate using agitated distilled water as described above in Invention Example 2.

The resulting intermediate article was then immersed within a 50:50 water:acetonitrile solution of 0.001 molar palladium chloride containing electroless palladium seed ions for 10 minutes and rinsed with distilled water. The palladium ions within the exposed regions in the polymeric layer were then contacted with a 1 weight % aqueous-based dimethylamine borane (DMAB) reducing bath for 5 minutes, rinsed with distilled water, and contacted with the electroless nickel(II) plating bath described above for 10 minutes at 55° C. A conductive nickel metal pattern was formed in the exposed regions of the resulting product article.

Invention Examples 8 & 9

Use of Reactive Composition with and without Water-Insoluble Photosensitizer For Invention Example 8, a reactive composition formulation was prepared containing 4.75 weight % of Polymer C, 0.05 weight % of Dupont Capstone FS-35 surfactant, and 0.043 weight % of 2-[bis(2-furoyl)methylene]-1-methylnaphtho[1,2-d]thiazoline (BFT photosensitizer) added from a 2 weight % solution in γ-butyrolactone. This photosensitizer formed a fine dispersion in the aqueous formulation upon thorough mixing. The reactive composition formulation was spin coated at 1000 RPM onto a PET [poly(ethylene terephthalate)] film substrate having a polymeric adhesion layer of a copolymer derived from glycidyl methacrylate and butyl acrylate that had been applied before stretching the PET film, to provide a polymeric layer on the substrate in a resulting precursor article.

The precursor article was imagewise exposed to 350 nm to 450 nm ultraviolet light through a chrome-on-quartz contact mask for 15 seconds. The exposed precursor was then baked at 60° C. for 60 seconds. The exposed and baked intermediate article was then immersed in well agitated distilled water for 2 minute 2 to wash off the reactive composition comprising the reactive polymers in the non-exposed regions. The washed intermediate article was then immersed within an aqueous-based 0.4 molar silver nitrate solution containing electroless seed silver ions for 1 minute, rinsed in distilled water, immersed in a 1 weight % aqueous-based dimethylamine borane (DMAB) reducing bath for 30 seconds, and then followed by a another distilled water rinse.

These resulting intermediate article was then immersed in the electroless copper(II) plating bath described above for 6 minutes. A brilliant continuous copper film was formed in all UV-exposed regions of the polymeric layer on the substrate in the resulting product article. In the resulting copper pattern, line widths of 5 to 6 μm diameter were faithfully reproduced and exhibited high conductivity.

Another precursor article was similarly prepared for Invention Example 9 except that the BFT photosensitizer was omitted. The resulting product article contained fine copper lines that represented poorer reproductions of the desired image at the 60 second exposure level. Such precursor article could likely be improved using an optimized reactive polymer or different exposure or treatment conditions.

Invention Examples 10 & 11

Use of Reactive Composition with Water-Soluble Photosensitizer

For Invention Example 10, a reactive composition formulation was prepared containing 4.25 weight % of Polymer C, 0.05 weight % of Dupont Capstone FS-35 surfactant, and 0.043 weight % of pyridinium, 3-((7-methoxy-2-oxo-2H-1-benzopyran-3-yl)carbonyl)-1-methyl, fluorosulfate as the photosensitizer. The reactive composition formulation was spin coated at 1000 RPM onto a PET [poly(ethylene terephthalate)] film substrate having a polymeric adhesion layer of a copolymer derived from glycidyl methacrylate and butyl acrylate that had been applied before stretching the PET film, to provide a polymeric layer on the substrate in a resulting precursor article.

The precursor article was imagewise exposed to 350 nm to 450 nm ultraviolet light through a chrome-on-quartz contact mask for 30 seconds and then baked at 60° C. for 60 seconds. The exposed and baked intermediate article was then immersed in well agitated distilled water for 2 minutes to wash off the reactive composition comprising the reactive polymer in the non-exposed regions. The washed intermediate article was then immersed within an aqueous-based 0.4 molar silver nitrate solution containing electroless seed silver ions for 1 minute, rinsed in distilled water, immersed in a 1 weight % aqueous-based dimethylamine borane (DMAB) reducing bath for 30 seconds, and followed by another distilled water rinse.

The resulting intermediate article was then immersed in the electroless copper(II) plating bath described above for 5 minutes. A brilliant continuous copper film was formed in all UV-exposed regions of the polymeric layer on the substrate in the product article. In the resulting copper pattern, line widths of 5 to 6 μm diameter were faithfully reproduced and exhibited high conductivity.

A precursor article was similarly prepared for Invention Example 11 except that the water soluble photosensitizer was omitted from the reactive composition. The resulting product article exhibited poorer copper line reproduction and lower conductivity at the 30 second exposure level. Such precursor article could likely be improved using optimized reactive polymer or different exposure or treatment conditions.

The invention has been described in detail with particular reference to certain preferred embodiments thereof, but it will be understood that variations and modifications can be effected within the spirit and scope of the invention.

The invention claimed is:

1. A method for forming a pattern in a polymeric layer, the method comprising:
   providing a polymeric layer comprising a reactive composition that comprises: (1) a reactive polymer that is metal ion-complexing, water-soluble, and crosslinkable, which reactive polymer comprises a backbone, and arranged in any order along the backbone, —A— recurring units that comprise pendant groups comprising crosslinkable —C(=O)—CR=CR$^1$—Y— groups wherein R and R$^1$ are independently hydrogen or an alkyl group having 1 to 7 carbon atoms, a 5- to 6-membered cycloalkyl group, an alkoxy group having 1 to 7 carbon atoms, a phenyl group, or a phenoxy group, and Y is a substituted or unsubstituted aryl or aromatic heterocyclic ring, in an amount of at least 2 mol %, and —B— recurring units comprising pendant metal ion-complexing and water-solubilizing groups in an amount of at least 50 mol %, both based on the total recurring units in the reactive polymer; and (2) optionally, a photosensitizer,
   patternwise exposing the polymeric layer to radiation having a $\lambda_{max}$ of at least 150 nm that is sufficient to induce crosslinking within the reactive polymer, to provide a polymeric layer comprising non-exposed regions and exposed regions comprising an at least partially crosslinked polymer derived from the reactive polymer,
   optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the exposed regions of the polymeric layer,
   removing the reactive composition comprising the reactive polymer in the non-exposed regions,
   contacting the exposed regions of the polymeric layer with electroless seed metal ions to form a pattern of electroless seed metal ions in the exposed regions of the polymeric layer,
   reducing the pattern of electroless seed metal ions to provide a pattern of corresponding electroless seed metal nuclei in the exposed regions of the polymeric layer, and
   electrolessly plating the corresponding electroless seed metal nuclei in the exposed regions of the polymeric layer with a metal that is the same as or different from the corresponding electroless seed metal nuclei.

2. The method of claim 1,
   wherein the —A— recurring units are present in an amount of at least 2 mol % and up to and including 50 mol %, and the —B— recurring units are present in an amount of at least 50 mol % and up to and including 98 mol %, both based on the total recurring units in the reactive polymer.

3. The method of claim 1, wherein the —B— recurring units comprise pendant carboxylic acid, carboxylate, sulfonic acid, or sulfonate groups.

4. The method of claim 1, wherein the reactive polymer comprises at least 10 mol % and up to and including 40 mol % of —A— recurring units comprising crosslinkable —C(=O)—CR=CR$^1$-phenyl groups wherein R and R$^1$ are independent hydrogen, methyl, ethyl, or phenyl groups, based on the total recurring units in the reactive polymer, and at least 60 mol % and up to and including 90 mol % of —B— recurring units.

5. The method of claim 1, wherein the reactive polymer further comprises one or more additional —C— recurring units that are different from all —A— and —B— recurring units, the one or more additional —C— recurring units being present in an amount of up to and including 20 mol % based on the total reactive polymer recurring units.

6. The method of claim 1, wherein the reactive polymer comprises at least 50 weight % and up to 100 weight % of the total dry weight of the polymeric layer.

7. The method of claim 1, wherein the reactive composition further comprises a photosensitizer in the polymeric layer in an amount of at least 0.1 weight % based on the total solids in the polymeric layer, which photosensitizer provides sensitization at a $\lambda_{max}$ of at least 150 nm and up to and including 700 nm.

8. The method of claim 1, further comprising:
heating the polymeric layer after patternwise exposing the polymeric layer but before removing the reactive composition comprising the reactive polymer in the non-exposed regions, at a temperature sufficient to further crosslink the at least partially crosslinked polymer in the exposed regions of the polymeric layer.

9. The method of claim 1, comprising contacting the exposed regions in the polymeric layer with electroless seed metal ions selected from the groups consisting of silver ions, platinum ions, palladium ions, gold ions, rhodium ions, nickel ions, iridium ions, tin ions, and copper ions.

10. The method of claim 1, comprising electrolessly plating with a metal that is selected from the group consisting of copper(II), silver(I), gold(IV), palladium(II), platinum(II), nickel(II), chromium(II), and combinations thereof.

11. The method of claim 1, comprising patternwise exposing the polymeric layer to radiation having a $\lambda_{max}$ of at least 150 nm and up to and including 450 nm.

12. The method of claim 1, comprising reducing the electroless seed metal ions in the exposed regions of the polymeric layer with a reducing agent that is a borane, aldehyde, hydroquinone, or sugar reducing agent.

13. A precursor article used in the method of claim 1, the precursor article comprising a substrate and having disposed thereon a polymeric layer comprising a reactive composition that comprises:
(1) a reactive polymer that is metal ion-complexing, water-soluble, and crosslinkable, which reactive polymer comprises a backbone, and arranged in any order along the backbone, —A— recurring units that comprise pendant groups comprising crosslinkable —C(=O)—CR=CR$^1$—Y— groups wherein R and R$^1$ are independently hydrogen or an alkyl group having 1 to 6 carbon atoms, a 5- to 6-membered cycloalkyl group, an alkoxy group having 1 to 6 carbon atoms, a phenyl group, or a phenoxy group, and Y is a substituted or unsubstituted aryl or aromatic heterocyclic ring, in an amount of at least 2 mol %; and —B— recurring units comprising pendant metal ion-complexing and water-solubilizing groups in an amount of at least 50 mol %, both based on the total recurring units in the reactive polymer, and (2) optionally, a photosensitizer.

14. The precursor article of claim 13,
wherein the —A— recurring units are present in an amount of at least 2 mol % and up to and including 50 mol %, and the —B— recurring units are present in an amount of at least 50 mol % and up to and including 98 mol %, both based on the total recurring units in the reactive polymer.

15. The precursor article of claim 13, wherein the —B— recurring units comprise pendant carboxylic acid, carboxylate, sulfonic acid, or sulfonate groups.

16. The precursor article of claim 13, wherein the reactive polymer comprises at least 10 mol % and up to and including 40 mol % of —A— recurring units comprising crosslinkable —C(=O)—CR=CR$^1$-phenyl groups wherein R and R$^1$ are independent hydrogen, methyl, ethyl, or phenyl groups, based on the total recurring units in the reactive polymer, and at least 60 mol % and up to and including 90 mol % of —B— recurring units.

17. The precursor article of claim 13, wherein the reactive polymer further comprises one or more additional —C— recurring units that are different from all —A— and —B— recurring units, the one or more additional —C— recurring units being present in an amount of up to and including 20 mol % based on the total reactive polymer recurring units.

18. The precursor article of claim 13, wherein the reactive composition further comprises a photosensitizer in the polymeric layer in an amount of at least 0.1 weight % based on the total solids in the polymeric layer, which photosensitizer provides sensitization at a $\lambda_{max}$ of at least 150 nm and up to and including 700 nm.

19. A product article prepared by the method of claim 1, the product article comprising a substrate and having disposed thereon a polymeric layer comprising exposed regions and non-exposed regions,
the exposed regions comprising a pattern of electrolessly plated metal complexed within or deposited on the surface of an at least partially crosslinked polymer that has been derived from a reactive polymer that is metal ion-complexing, water-soluble, and crosslinkable, which reactive polymer comprises a backbone, and arranged in any order along the backbone, —A— recurring units that comprise pendant groups comprising crosslinkable —C(=O)—CR=CR$^1$—Y— groups wherein R and R$^1$ are independently hydrogen or an alkyl group having 1 to 7 carbon atoms, a 5- to 6-membered cycloalkyl group, an alkoxy group having 1 to 7 carbon atoms, a phenyl group, or a phenoxy group, and Y is a substituted or unsubstituted aryl or aromatic heterocyclic ring, in an amount of at least 2 mol %, and —B— recurring units comprising pendant metal ion-complexing and water-solubilizing groups in an amount of at least 50 mol %, both based on the total recurring units in the reactive polymer, and
the non-exposed regions comprising none of the electrolessly plated metal or the reactive polymer that is metal ion-complexing, water-soluble, and crosslinkable.

* * * * *